(12) United States Patent
Kim et al.

(10) Patent No.: US 11,501,823 B2
(45) Date of Patent: Nov. 15, 2022

(54) SEMICONDUCTOR MEMORY DEVICES INCLUDING SENSE AMPLIFIER ADJUSTED BASED ON ERROR INFORMATION

(71) Applicant: SAMSUNG ELECTRONICS CO., LTD., Suwon-si (KR)

(72) Inventors: Sangyun Kim, Hwaseong-si (KR); Younghun Seo, Hwaseong-si (KR); Hyejung Kwon, Seoul (KR); Myungkyu Lee, Seoul (KR); Sunghye Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 354 days.

(21) Appl. No.: 16/812,850

(22) Filed: Mar. 9, 2020

(65) Prior Publication Data
US 2021/0027830 A1    Jan. 28, 2021

(30) Foreign Application Priority Data

Jul. 24, 2019   (KR) .......................... 10-2019-0089411

(51) Int. Cl.
| | | |
|---|---|---|
| *G11C 11/4091* | (2006.01) | |
| *G11C 11/56* | (2006.01) | |
| *G11C 11/4074* | (2006.01) | |
| *G06F 11/10* | (2006.01) | |

(52) U.S. Cl.
CPC ........ *G11C 11/4091* (2013.01); *G06F 11/106* (2013.01); *G11C 11/4074* (2013.01); *G11C 11/565* (2013.01)

(58) Field of Classification Search
CPC ............ G11C 11/4091; G11C 11/4074; G11C 11/565

USPC .................................................. 365/185.09
See application file for complete search history.

(56) References Cited

U.S. PATENT DOCUMENTS

| 5,233,610 | A  | * | 8/1993  | Nakayama ......... G06F 11/1076 365/201 |
|---|---|---|---|---|
| 7,305,596 | B2 | * | 12/2007 | Noda .................. G06F 11/1068 714/48 |
| 9,728,263 | B2 |   | 8/2017  | Sharon et al. |
| 10,055,286 | B2 |   | 8/2018  | Kim |
| 2006/0280019 | A1 |  | 12/2006 | Burton et al. |

(Continued)

FOREIGN PATENT DOCUMENTS

JP    2013-257918 A    12/2013

*Primary Examiner* — Connie C Yoha
(74) *Attorney, Agent, or Firm* — Sughrue Mion, PLLC

(57) ABSTRACT

A semiconductor memory device includes a memory cell array, an ECC engine, a voltage generator and a control logic circuit. The memory cell array includes a plurality of memory cells coupled to word-lines and bit-lines, and a plurality of sense amplifiers to sense data stored in the plurality of memory cells. The ECC engine reads memory data from a target page of the memory cell array, performs an ECC decoding on the memory data, detects, based on the ECC decoding, an error in the memory data, and outputs error information associated with the error. The voltage generator provides driving voltages to the plurality of sense amplifiers, respectively. The control logic circuit controls the ECC engine, and controls the at least one voltage generator to increase an operating margin of each of the plurality of sense amplifiers based on error pattern information including the error information.

19 Claims, 35 Drawing Sheets

(56) References Cited

U.S. PATENT DOCUMENTS

| | | |
|---|---|---|
| 2012/0005559 A1 | 1/2012 | Jeong et al. |
| 2016/0035407 A1 | 2/2016 | Pyeon |
| 2017/0249208 A1* | 8/2017 | Kim .................... G11C 29/021 |
| 2017/0262337 A1* | 9/2017 | Chang .................... G11C 29/50 |

* cited by examiner

FIG. 7A
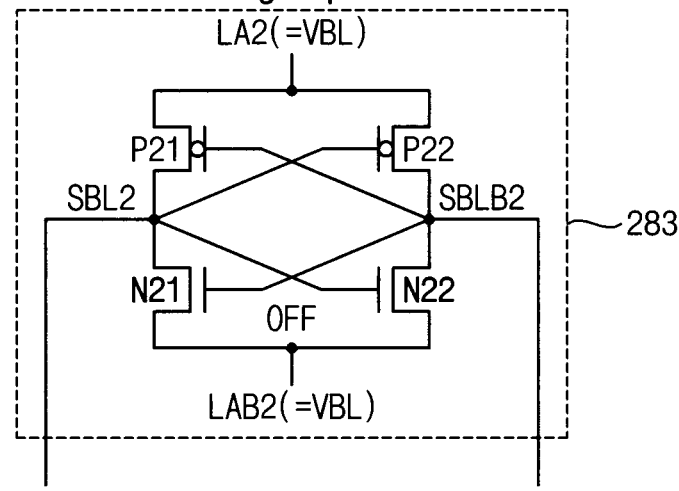
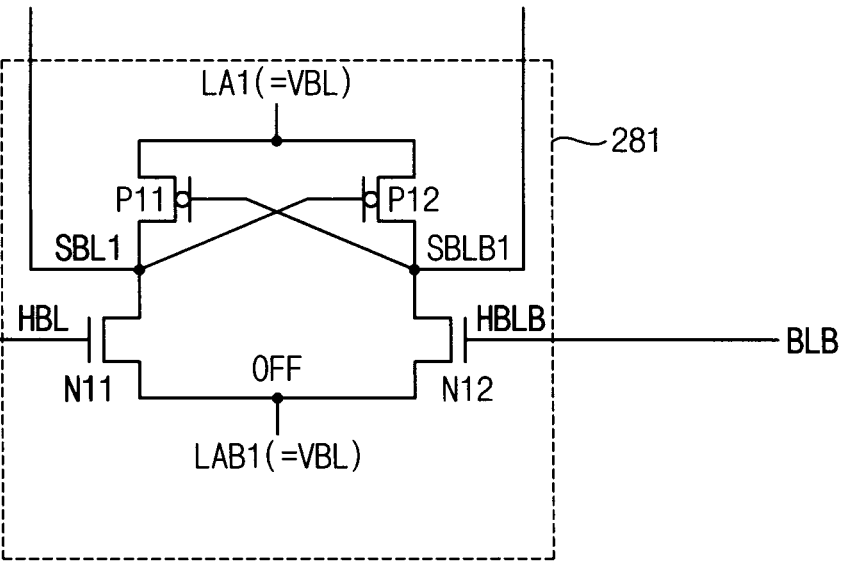

580

| | RNK | ADDINF (BGA,BA,RA) | ECNT | FCWCNT | FG |
|---|---|---|---|---|---|
| Idx1 | 2 | A | 2 | 2 | 0 |
| Idx2 | 1 | B | 4 | 3 | 0 |
| ⋮ | ⋮ | ⋮ | ⋮ | ⋮ | ⋮ |
| Idxu | 3 | X | 1 | 1 | 1 |
| | 581 | 582 | 583 | 584 | 585 |

FIG. 21A

| MULTI-BIT | DC CONTROL |
|---|---|
| 1  1 | |
| 1 [0] | VINTA1 UP |
| 0 [1] | |
| 0  0 | |

☐ : ERROR

FIG. 21B

| MULTI-BIT | DC CONTROL |
|---|---|
| 1 [1] | |
| 1  0 | VINTA1 DOWN |
| 0  1 | |
| 0 [0] | |

☐ : ERROR

FIG. 21C

| MULTI-BIT | DC CONTROL |
|---|---|
| [1] 1 | VBL DOWN |
| [1] 0 | |
| 0 [1] | |
| 0 0 | |

□ : ERROR

FIG. 21D

| MULTI-BIT | DC CONTROL |
|---|---|
| 1 1 | VBL UP |
| 1 [0] | |
| [0] 1 | |
| [0 0] | |

□ : ERROR

FIG. 21E

| MULTI-BIT | DC CONTROL |
|---|---|
| 1 [1] | |
| [1] 0 | VINTA2 & VBB2 UP |
| [0] 1 | |
| 0 [0] | |

☐ : ERROR

FIG. 21F

| MULTI-BIT | DC CONTROL |
|---|---|
| [1] 1 | |
| 1 [0] | VIN2A & VBB2 DOWN |
| 0 [1] | |
| [0] 0 | |

☐ : ERROR

SEMICONDUCTOR MEMORY DEVICES INCLUDING SENSE AMPLIFIER ADJUSTED BASED ON ERROR INFORMATION

CROSS-REFERENCE TO RELATED APPLICATION(S)

This application claims priority to Korean Patent Application No. 10-2019-0089411, filed on Jul. 24, 2019, in the Korean Intellectual Property Office, the disclosure of which is incorporated by reference in its entirety herein.

BACKGROUND

Devices and methods consistent with the present disclosure relate to memories, and more particularly to semiconductor memory devices and methods of operating semiconductor memory devices.

Semiconductor memory devices may be classified into non-volatile memory devices such as flash memory devices and volatile memory devices such as dynamic random access memories (DRAMs). High speed operation and cost efficiency of DRAMs make it possible for DRAMs to be used for system memories. Due to the continuing shrink in fabrication design rule of DRAMs, bit errors of memory cells in the DRAMs may rapidly increase and yield of the DRAMs may decrease. Therefore, there is a need for credibility of the semiconductor memory device.

SUMMARY

Example embodiments may provide a semiconductor memory device capable of enhancing performance.

Example embodiments may provide a method of operating a semiconductor memory device, capable of enhancing performance.

According to an aspect of an example embodiment, there is provided a semiconductor memory device including: a memory cell array including a plurality of memory cells coupled to word-lines and bit-lines, and a plurality of sense amplifiers configured to sense data stored in the plurality of memory cells; an error correction code (ECC) engine configured to read memory data from a target page of the memory cell array, perform an ECC decoding on the memory data, detect, based on the ECC decoding, an error in the memory data, and output error information associated with the error; at least one voltage generator configured to provide driving voltages to the plurality of sense amplifiers, respectively; and a control logic circuit configured to control the ECC engine, and control the at least one voltage generator to increase an operating margin of each of the plurality of sense amplifiers based on error pattern information, wherein the error pattern information includes the error information.

According to an aspect of an example embodiment, there is provided semiconductor memory device including: a memory cell array including a plurality of memory cells coupled to word-lines and bit-lines, each memory cell of the plurality of memory cells storing multi-bit data, and a plurality of sense amplifiers configured to sense the multi-bit data; an error correction code (ECC) engine configured to read memory data from a target page of the memory cell array, perform an ECC decoding on the memory data, generate, based on the ECC decoding, error information indicating an error pattern of the multi-bit data, and output the error information; at least one voltage generator configured to provide driving voltages to the plurality of sense amplifiers, respectively; and a control logic circuit configured to control the ECC engine, control the at least one voltage generator to increase an operating margin of each of the plurality of sense amplifiers based on error pattern information, wherein the error pattern information includes the error information, record the error pattern information, and control the at least one voltage generator to adjust voltage levels of the driving voltages based on the error pattern information.

According to an aspect of an example embodiment, there is provided a method of operating a semiconductor memory device, the method including: reading memory data from a target page of a memory cell array of the semiconductor memory device, the memory cell array including a plurality of memory cells coupled to word-lines and bit-lines, and a plurality of sense amplifiers configured to sense data stored in the plurality of memory cells; performing, by an error correction code (ECC) engine of the semiconductor memory device, ECC decoding of the memory data; generating, by the ECC engine, error information based on the ECC decoding; controlling, by a control logic circuit of the semiconductor memory device, at least one voltage generator to adjust, based on error pattern information, voltage levels of driving voltages, wherein the error pattern information includes the error information, and wherein the at least one voltage generator is configured to provide the driving voltages to the plurality of sense amplifiers; sensing the memory data by applying the driving voltages to at least some of the plurality of sense amplifiers; and restoring the memory data by applying the driving voltages to at least some of the plurality of sense amplifiers.

Accordingly, the control logic circuit generates error pattern information by accumulating error information obtained by a result of ECC decoding and the control logic circuit controls the voltage generator to adjust voltage levels of driving voltages provided to sense amplifiers based on the error pattern information such that operating margin of the sense amplifier may be increased. Therefore, the semiconductor memory device may enhance performance.

BRIEF DESCRIPTION OF THE DRAWINGS

Example embodiments will be described below in more detail with reference to the accompanying drawings, in which:

FIGS. 7A to 7K are equivalent circuits illustrating an operation of the sense amplifier of FIG. 5;

FIGS. 21A through 21F, respectively, illustrate that the control logic circuit controls the voltage generator to adjust a voltage level of driving voltages based on the error pattern information;

DETAILED DESCRIPTION

Various example embodiments will be described more fully hereinafter with reference to the accompanying drawings.

Figure 1:
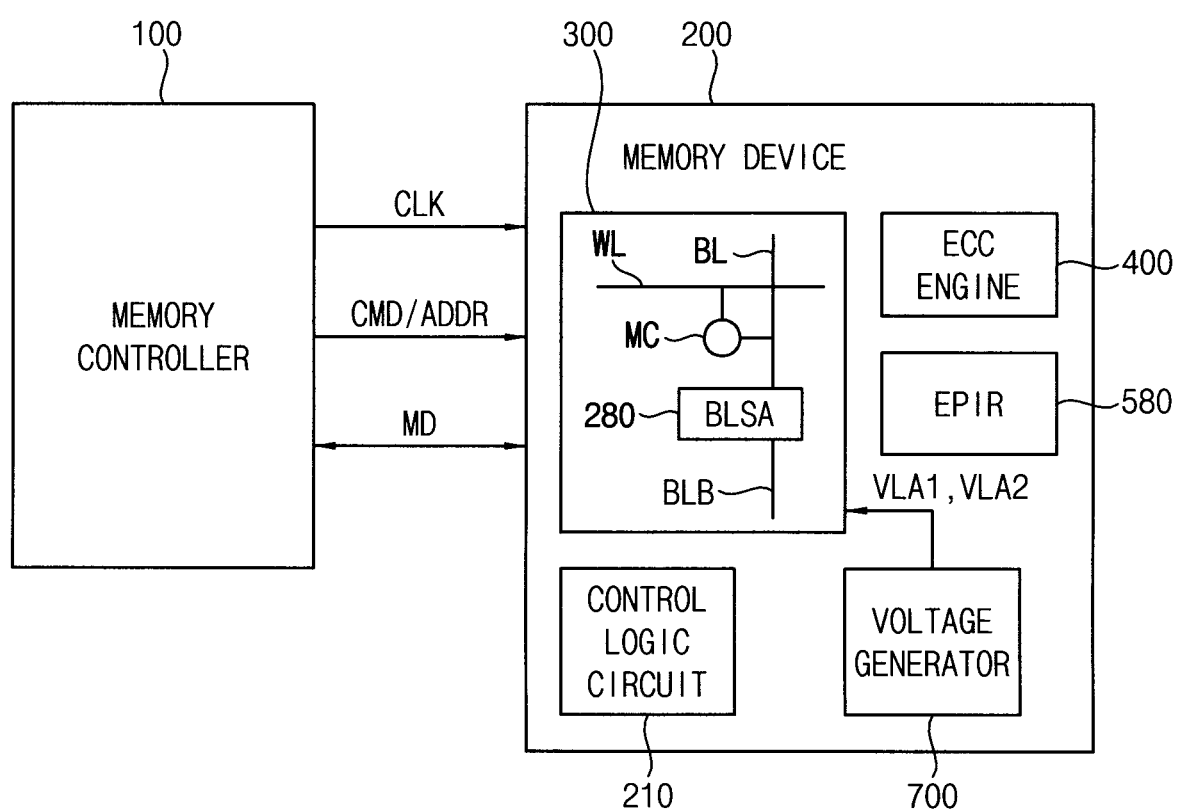
FIG. 1 is a block diagram illustrating a memory system according to example embodiments.

FIG. 1 is a block diagram illustrating a memory system according to example embodiments.

Referring to FIG. 1, a memory system 20 may include a memory controller 100 and a semiconductor memory device 200.

The memory controller 100 may control overall operation of the memory system 20. The memory controller 100 may control overall data exchange between an external host and the semiconductor memory device 200. For example, the memory controller 100 may write data in the semiconductor memory device 200 or read data from the semiconductor memory device 200 in response to request from the host. In addition, the memory controller 100 may issue operation commands to the semiconductor memory device 200 for controlling the semiconductor memory device 200. The memory controller 100 transmits a clock signal CLK, a command CMD (signal) and an address (signal) ADDR to the semiconductor memory device 200 and exchanges main data MD with the semiconductor memory device 200.

In some embodiments, the semiconductor memory device 200 is a memory device including dynamic memory cells such as a dynamic random access memory (DRAM), double data rate 4 (DDR4) synchronous DRAM (SDRAM), a DDR5 SDRAM a low power DDR4 (LPDDR4) SDRAM or a LPDDR5 SDRAM.

The semiconductor memory device 200 includes a memory cell array 300 that stores the main data MD and parity bits, an error correction code (ECC) engine 400, a control logic circuit 210, an error pattern information register (EPIR) 580 and at least one voltage generator 700. The EPIR 580 may be included in the control logic circuit 210.

The memory cell array 300 may include a plurality of memory cells MCs coupled to each word-line WL and each bit-line BL and a sense amplifier BLSA 280 coupled to the bit-line BL and a complementary bit-line BLB.

The control logic circuit 210 controls the ECC engine 400 such that the ECC engine 400 may perform an ECC encoding on data to be stored in a target page of the memory cell array 300 and may perform an ECC decoding on data read from the target page. The ECC engine 400 may output error information to the control logic circuit 210 and the error information is associated an error which is detected in the read data based on a result of the ECC decoding.

The control logic circuit 210 may control the at least one voltage generator 700 to adjust voltage levels of driving voltages VLA1 and VLA2 based on error pattern information including the error information. The voltage generator 700 generates the driving voltages VLA1 and VLA2 under control of the control logic circuit 210 and provides the driving voltages VLA1 and VLA2 to the sense amplifier 280. For example, VLA1 may be provided to sense amplifier 280 at the node LA1 as a voltage LINTA1. VLA2 may be provided to sense amplifier 280 at the node LA2 as a voltage LINTA2. The control logic circuit 210 may control the voltage generator 700 to increase an operating margin of the sense amplifier 280 during the sense amplifier 280 performs sensing/restore operation based on the adjusted driving voltages VLA1 and VLA2.

Figure 2:
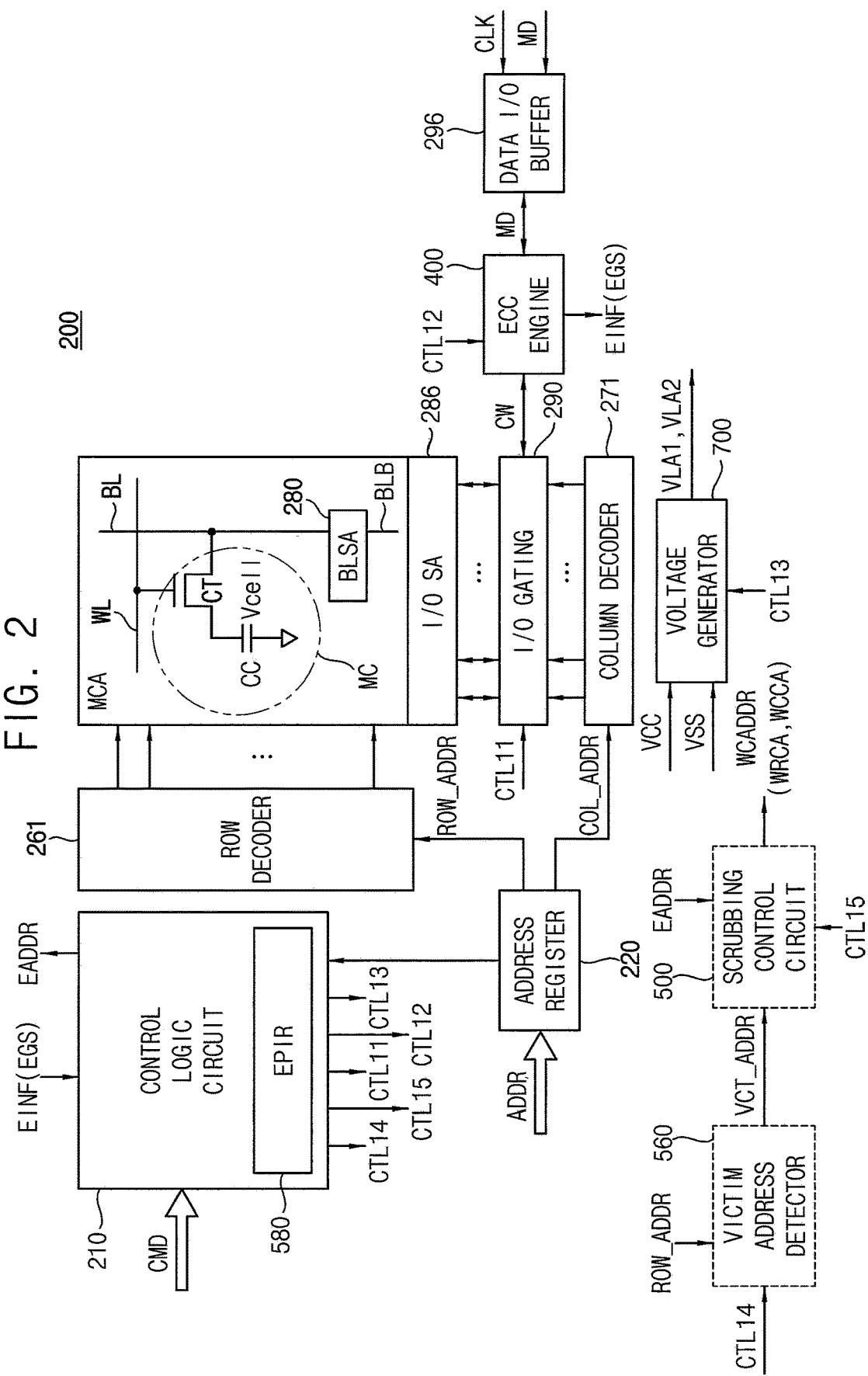
FIG. 2 is a block diagram illustrating an example of the semiconductor memory device in FIG. 1 according to example embodiments.

FIG. 2 is a block diagram illustrating an example of the semiconductor memory device in FIG. 1 according to example embodiments.

Referring to FIG. 2, the semiconductor memory device 200 may include the control logic circuit 210, the memory cell array 300, a row decoder 261, a column decoder 271, an input/output (I/O) gating circuit 290, and I/O sense amplifier 286, the ECC engine 400, a data I/O buffer 296 and the voltage generator 700.

The memory cell array 300 may include a plurality of memory cells MCs coupled to each word-line WL and each bit-line BL and a sense amplifier BLSA 280 coupled to the bit-line BL and a complementary bit-line BLB. Each of the memory cells MCs includes a cell transistor CT and a cell capacitor CC. A gate of the cell transistor CT is connected to one of the word-lines WLs arranged in a row direction of the memory cell array 300. One end of the cell transistor CT is connected to one of the bit-lines BLs arranged in a column direction of the memory cell array 300. The other end of the cell transistor CT is connected to the cell capacitor CC. The cell capacitor CC may store charges of various capacities corresponding to multi-bit data, for example, 2-bit data or may store a single bit data. The cell capacitor CC may be restored with an amount of charge that corresponds to a capacity of each of the multi-bit data items, that is, the cell capacitor CC may be restored to the cell voltage Vcell.

The control logic circuit 210 may generate control signals for controlling operations of the semiconductor memory device 200 based on the command CMD and the address ADDR from the memory controller 100. The control logic circuit 210 may generate a first control signal CTL11 to control the I/O gating circuit 290, a second control signal CTL12 to control the ECC engine 400, and a third control signal CTL13 to control the voltage generator 270. The control logic circuit 210 may include the EPIR 580.

The address register 220 receives the address ADDR from the memory controller 100, provides a row address ROW_ADDR to the row decoder 261, and provides a column address COL_ADDR to the column decoder 271. The row decoder 261 decodes the row address ROW_ADDR and may enable the word-line WL of the memory cell MC corresponding to the row address ROW_ADDR. The column decoder 271 decodes the column address COL_ADDR and may select the bit-line corresponding to the column address COL_ADDR.

The I/O gating circuit 290 may be connected between the I/O sense amplifier 286 and the ECC engine 400. The I/O sense amplifier 286 senses and amplifies the data read from the memory cell array 300 to provide the sensed data to the I/O gating circuit 290.

The ECC engine 400 may perform an ECC encoding on a write data MD to generate parity bits and may provide a codeword CW including the write data MD and the parity bits to the I/O gating circuit 290 in a write operation. The ECC engine 400 may perform an ECC decoding on a codeword CW to provide the main data MD to the data I/O buffer 296 in a read operation and may provide the control logic circuit 210 with error information EINF including error generation signal EGS if an error is detected in the read data based on a result of the ECC decoding. The error information EINF may include information on a number of errors and position in which the errors occur.

The data I/O buffer 296 may receive the clock signal CLK and the main data MD from the memory controller 100 and may provide the main data MD to the ECC engine 400. The data I/O buffer 296 may receive the main data in which an error is corrected from the ECC engine 400 and may provide the main data MD to the memory controller 100.

The control logic circuit 210 may accumulate the error information EINF associated with a page of a sub-page corresponding to an address associated with an error based on the error information EINF and may record the accumulated error information in the EPIR 580 as an error pattern information EPI. The accumulated error information (i.e., the pattern information EPI) in the EPIR 580 may represent error pattern or tendency of a page in which the errors occur. The control logic circuit 210 may control the voltage generator 700 to adjust voltage levels of at least one of the driving voltages VLA1 and VLA2 and a pre-charge voltage VBL. The pre-charge voltage may be used for pre-charging the bit-line BL and the complementary bit-line BLB.

The voltage generator 700 may generate the driving voltages VLA1 and VLA2 and the pre-charge voltage VBL based on voltages VCC and VSS and may adjust voltage levels of at least one of the driving voltages VLA1 and VLA2 and the pre-charge voltage VBL based on the third control signal CTL13 and may provide the driving voltages VLA1 and VLA2 and the pre-charge voltage VBL to the sense amplifier 280.

The semiconductor memory device 200 may further include a scrubbing control circuit 500 and a victim address detector 560. The control logic circuit 210 may provide a fourth control signal CTL14 to the victim address detector 560 and may provide a fifth control signal CTL15 to the scrubbing control circuit 500.

The victim address detector 560 may count a number of accesses to a first memory region in the memory cell array 300 to generate at least one victim address VCT_ADDR designating at least one adjacent memory region adjacent to the first memory region when the number of the counted accesses reaches a reference number of times during a reference interval. The victim address VCT_ADDR may be stored in the address storing table of the scrubbing control circuit 500.

The scrubbing control circuit 500 may output an address of codeword associated with the victim address VCT_ADDR stored in the address storing table as a weak codeword address WCADDR. The weak codeword address WCADDR may include a weak codeword row address WCRA and a weak codeword column address WCCA. The scrubbing control circuit 500 may provide the weak codeword row address WCRA and the weak codeword column address WCCA to the row decoder 261 and the column decoder 271.

The control logic circuit 210 may provide the scrubbing control circuit 500 with an address of a target page associated with an detected error as an error address EADDR. The control logic circuit 210 may control the ECC engine 400 to perform a scrubbing operation on sub-pages of the target page associated with a detected error. The ECC engine 400 may perform the scrubbing operation by reading data from a memory location corresponding to the sub-page, correcting an error and writing back the corrected data to the memory location corresponding to the sub-page.

Figure 3:
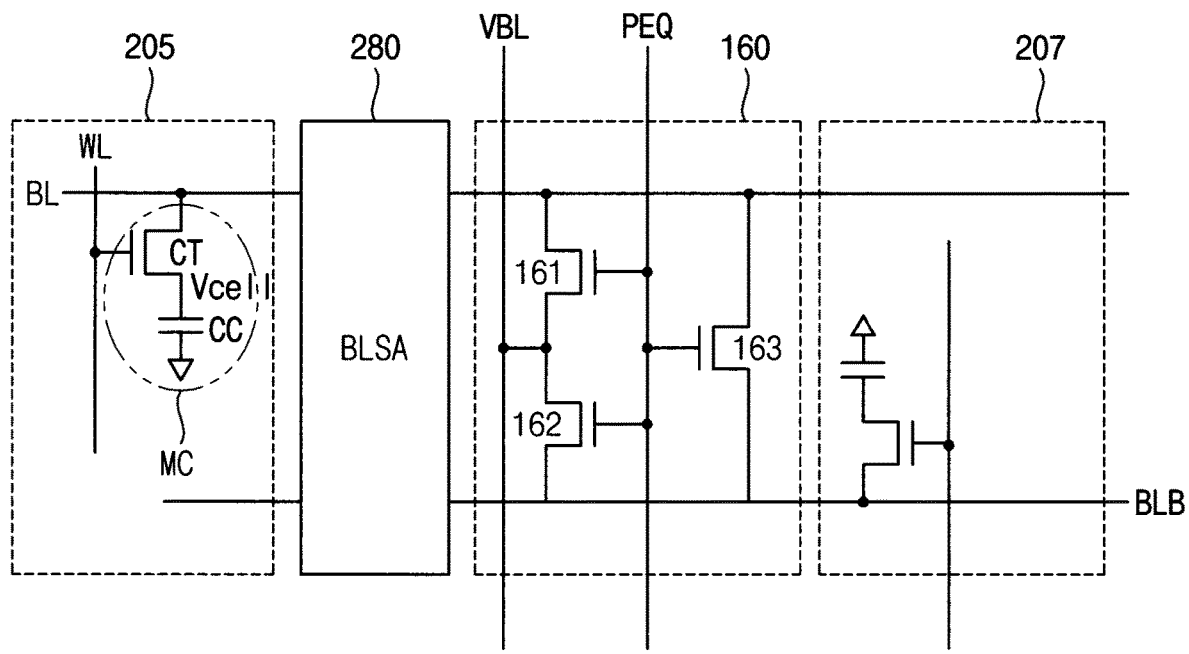
FIG. 3 illustrates the memory cell and the sense amplifier in the semiconductor memory device in FIG. 2.

FIG. 3 illustrates the memory cell and the sense amplifier in the semiconductor memory device in FIG. 2.

Referring to FIG. 3, the sense amplifier 280 may be connected to the memory cell MC and an equalizing circuit 160 through a pair of bit-lines BL and BLB. The equalizing circuit 160 includes first through third transistors 161, 162 and 163. The first through third transistors 161, 162 and 163 equalize the pair of bit-lines BL and BLB with a pre-charge voltage VBL (FIG. 7A) in response to an equalizing signal PEQ. The equalizing signal PEQ may be provided by the control logic circuit 210 in accordance with a pre-charge command. The pre-charge voltage VBL may be set to have a level corresponding to a half of a level of a power voltage driving the sense amplifier 280.

The sense amplifier 280 may be configured in an open bit-line structure and is connected to the memory cell MC. In the open bit-line structure, the pair of bit-lines BL and BLB are separately positioned in different adjacent main cell blocks 205 and 207. In the open bit-line structure, when the word-line WL of the selected memory cell MC is enabled, the data of the memory cell MC may be read or written through the selected bit-line BL. At this time, while the data of the memory cell MC is accessed via the selected bit-line BL, since the selected memory cell is not on the complementary bit-line BLB, the level of the pre-charge voltage VBL is maintained as a reference voltage level. Therefore, the sense amplifier 280 may sense the cell voltage Vcell of the memory cell MC by using charges shared through the bit-line BL.

The sense amplifier 280 may be configured to sense the cell voltage Vcell stored in the memory cell MC as a first bit corresponding to a most significant bit (MSB) and a second bit corresponding to a least significant bit (LSB) of the 2-bit data and, after sensing, may be configured to restore the cell voltage Vcell corresponding to the sensed MSB and LSB in the memory cell MC. For example, the sense amplifier 280 may perform first to third charge sharing operations by using a cell capacitance of the memory cell MC, a bit-line capacitance of each of the pair of bit-lines BL and BLB, a bit-line capacitance of each of a pair of holding bit-lines HBL and HBLB (FIG. 5), a bit-line capacitance of each of the pair of first sensing bit-lines SBL1 and SBLB1 (FIG. 5), and a bit-line capacitance of each of a pair of second sensing bit-lines SBL2 and SBLB2 (FIG. 5) and changes in the bit-line capacitances. The sense amplifier 280 senses the MSB and LSB of the 2-bit data by performing the first to third charge sharing operations, and may restore the cell voltage Vcell corresponding to the sensed MSB and LSB in the memory cell MC.

The sense amplifier 280 may combine the sensed MSB and LSB by performing the third charge sharing operation. The sense amplifier 280 may restore the cell voltage Vcell generated in accordance with the combination of the sensed MSB and LSB in the memory cell MC.

Figure 4:
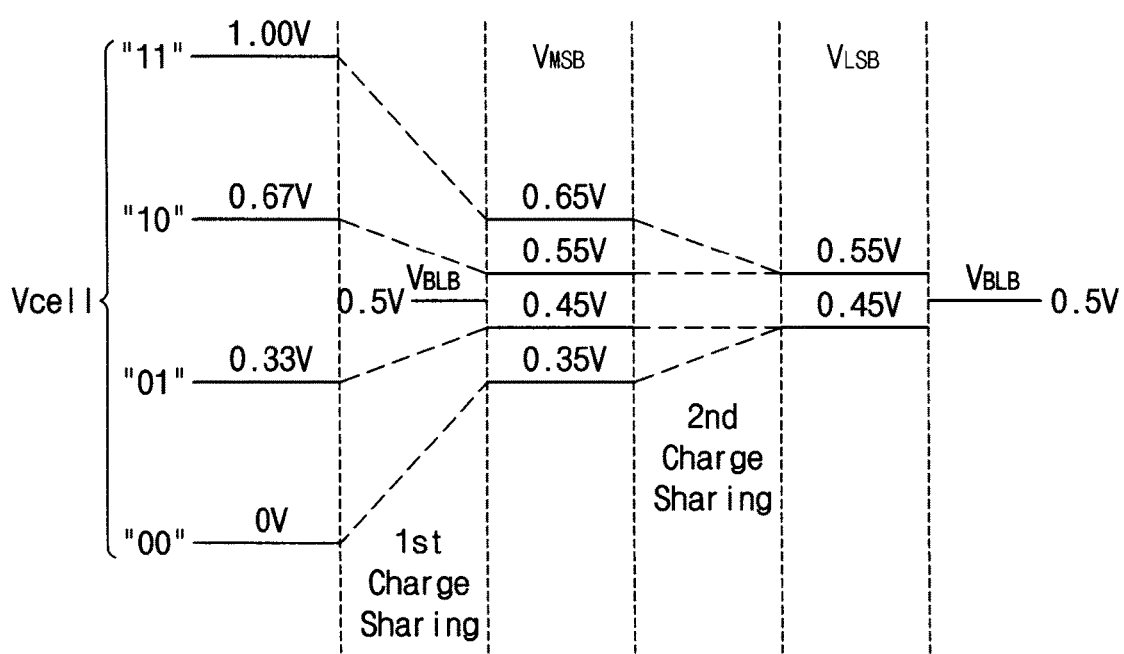
FIG. 4 illustrates multi-bit data of a memory cell sensed by the sense amplifier 280 in FIG. 3.

FIG. 4 illustrates multi-bit data of a memory cell sensed by the sense amplifier 280 in FIG. 3.

Referring to FIG. 4, the cell voltage Vcell of the memory cell MC represents the MSB and the LSB of the 2-bit data. Different cell voltage Vcell stored in the memory cell MC may represent a different respective one of the bit combinations "00", "01", "10", or "11". For example, when the power voltage VINTA is 1.0 V, it may be set so that a voltage difference of about 330 mV to 340 mV is provided between bit combinations. That is, the cell voltage Vcell of 0 V may represent the bit combination "00", the cell voltage Vcell of 0.33 V may represent the bit combination "01", the cell voltage Vcell of 0.67 V may represent the bit combination "10", and the cell voltage Vcell of 1.0 V may represent the bit combination "11".

In example embodiments, levels of the cell voltage Vcell representing each of the bit combinations "00", "01", "10", or "11" may be varied.

In the sense amplifier 280 for sensing the MSB of the memory cell MC, when the first charge sharing operation is performed including charge sharing between the charges stored in the cell capacitor CC and the charges stored in the bit-line BL and in the holding bit-line HBL, the bit-line BL and the holding bit-line HBL are captured to have a prescribed MSB voltage $V_{MSB}$. The bit-line BL may be transited from the pre-charge voltage VBL level, that is, 0.5 V to the MSB voltage $V_{MSB}$. At this time, the complementary bit-line BLB may maintain the level of the pre-charge voltage VBL.

For example, a voltage level of the bit-line BL may be captured as the MSB voltage $V_{MSB}$ of about 0.35 V by the first charge sharing operation for the cell voltage Vcell of 0 V of the bit combination "00". The voltage level of the bit-line BL may be captured as the MSB voltage $V_{MSB}$ of about 0.45 V by the first charge sharing operation for the cell voltage Vcell of 0.33 V of the bit combination "01". The voltage level of the bit-line BL may be captured as the MSB voltage $V_{MSB}$ of about 0.55 V by the first charge sharing operation for the cell voltage Vcell of 0.67 V of the bit combination "10". The voltage level of the bit-line BL may be captured as the MSB voltage $V_{MSB}$ of about 0.65 V by the first charge sharing operation for the cell voltage Vcell of 1.0 V of the bit combination "11".

The voltage level of the bit-line BL of each of the bit combinations "00", "01", "10", and "11" in accordance with the first charge sharing operation thus may be captured as the MSB voltage $V_{MSB}$ of about 0.35 V, 0.45 V, 0.55 V, or 0.65 V, respectively. At this time, the complementary bit-line BLB maintains the pre-charge voltage VPRE of 0.5 V. A prescribed voltage difference, that is, −150 mV, −50 mV, 50 mV, or 150 mV, may lie between the MSB voltage $V_{MSB}$ of the bit-line BL and a complementary bit-line voltage $V_{BLB}$ of 0.5 V, with the different prescribed voltage differences corresponding respectively to the bit combinations "00", "01", "10", and "11".

In the sense amplifier 280 for sensing the LSB of the memory cell MC, when the second charge sharing operation is performed including charge sharing generated between the charges stored in the bit-line BL and the holding bit-line HBL and the charges stored in the first sensing bit-line SBL1, and also charge sharing generated between the charges stored in the complementary bit-line BLB and the complementary holding bit-line HBLB and the charges stored in the first complementary sensing bit-line SBLB1, the bit-line BL is captured as a prescribed LSB voltage $V_{LSB}$. The bit-line BL may be transited from the MSB voltage $V_{MSB}$ to the LSB voltage $V_{LSB}$.

For example, for the bit combination "00", the voltage level of the bit-line BL having the MSB voltage $V_{MSB}$ of about 0.35 V may be captured as the LSB voltage $V_{LSB}$ of about 0.45 V in the second charge sharing operation. At this time, the voltage level of the complementary bit-line BLB may be captured as the complementary bit-line voltage $V_{BLB}$ of about 0.5 V. For the bit combination "01", the voltage level of the bit-line BL having the MSB voltage $V_{MSB}$ of about 0.45 V mat be captured as the LSB voltage $V_{LSB}$ of about 0.45 V in the second charge sharing operation, and the complementary bit-line voltage $V_{BLB}$ may be captured as 0.5 V. For the bit combination "10", the voltage level of the bit-line BL having the MSB voltage $V_{MSB}$ of 0.55 V may be captured as the LSB voltage $V_{LSB}$ of about 0.55 V in the second charge sharing operation, and the complementary bit-line voltage $V_{BLB}$ may be captured as 0.5 V. For the bit combination "11", the voltage level of the bit-line BL having the MSB voltage $V_{MSB}$ of 0.65 V may be captured as the LSB voltage $V_{LSB}$ of about 0.55 V in the second charge sharing operation, and the complementary bit-line voltage $V_{BLB}$ may be captured as 0.5 V.

The voltage level of the bit-line BL of each of the bit combinations "00" and "01" in accordance with the second charge sharing operation is captured as the LSB voltage $V_{LSB}$ of about 0.45 V and 0.45 V, respectively, and the level of the complementary bit-line voltage $V_{BLB}$ is captured as about 0.5 V. The voltage level of the bit-line BL of each of the bit combinations "10" and "11" is captured as the LSB voltage $V_{LSB}$ of about 0.55 V and 0.55 V, respectively, and the level of the complementary bit-line voltage $V_{BLB}$ is captured as about 0.55 V. A prescribed voltage difference, corresponding to each of the bit combinations "00", "01", "10", and "11", that is, −50 mV, 50 mV, −50 mV, or 50 mV, lies between the LSB voltage $V_{LSB}$ of the bit-line BL and the complementary bit-line voltage $V_{BLB}$, which means that the LSB voltage $V_{LSB}$ corresponding to each of the bit combinations "00", "01", "10", and "11" operates as a self-reference that does not require an additional reference voltage for sensing the LSB voltage $V_{LSB}$.

Figure 5:
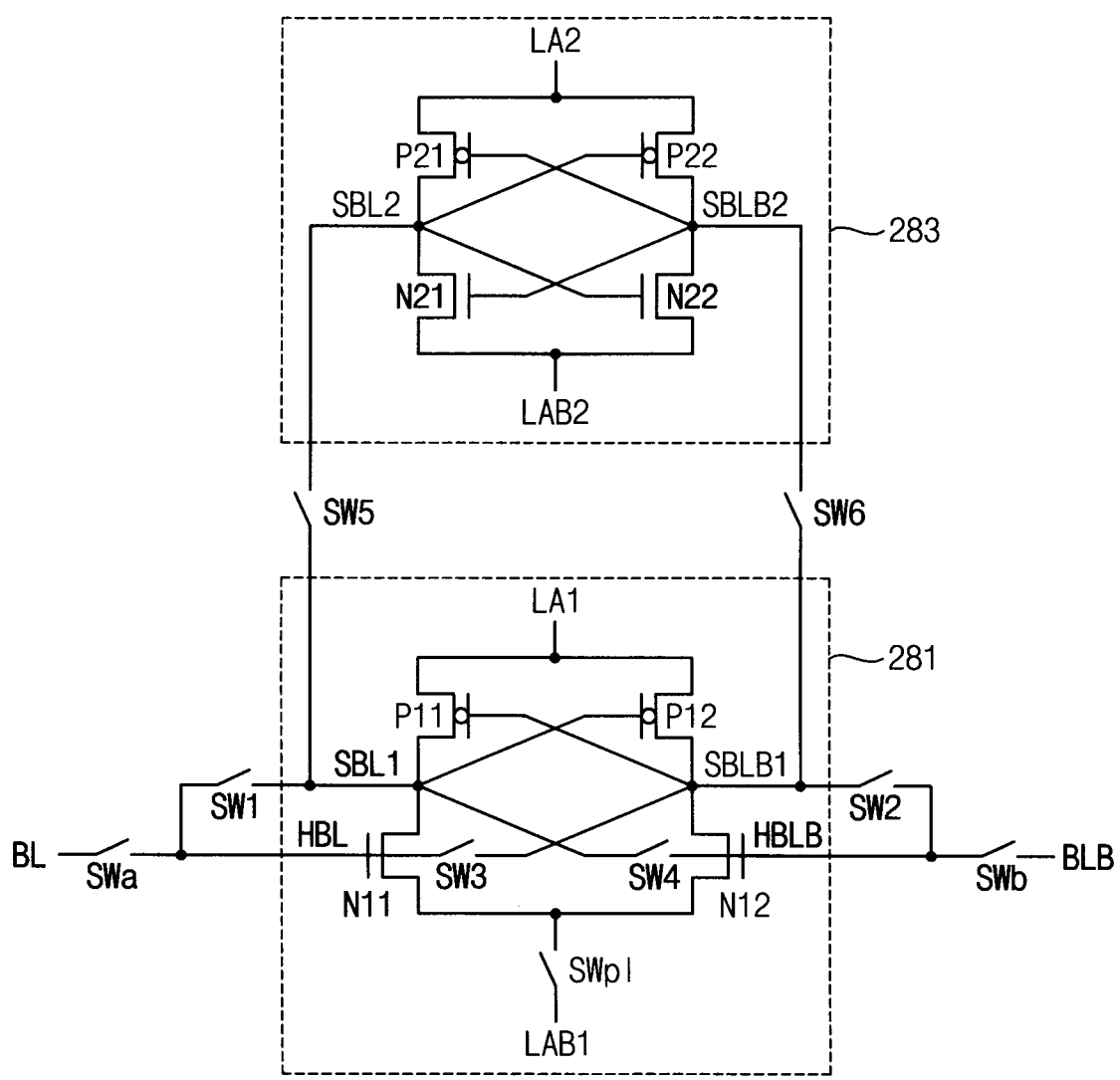
FIG. 5 is a circuit diagram illustrating an example of the sense amplifier in FIG. 3 according to according to example embodiments.

FIG. 5 is a circuit diagram illustrating an example of the sense amplifier in FIG. 3 according to according to example embodiments.

Referring to FIG. 5, the sense amplifier 280 may include a sense amplifying circuit 280, a latch circuit 283 and a switching circuit including a bit-line switch SWa, a complementary bit-line switch SWb, a power switch SW10, and first to sixth switches SW1 to SW6.

In some embodiments, the latch circuit 283 operates with a second power supply voltage, for example, VINTA2 applied to LA2 and with a third voltage level, which may be negative with respect to a reference ground of sense amp 280, applied to signal node LAB2.

The sense amplifying circuit 281 is connected to a first sensing signal node LA1 and a second sensing signal node LAB1 and includes p-channel metal-oxide-semiconductor (PMOS) transistors P11 and P12 and n-channel metal-oxide-semiconductor (NMOS) transistors N11 and N12. A margin of the sense amplifying circuit 281 may be the difference between the first and second sensing signal nodes. A first power supply voltage VINTA1, a ground voltage VSS, and the pre-charge voltage VBL may be applied to each of the first and second sensing signal nodes LA1 and LAB1 in accordance with control of the control logic circuit 210 for controlling an operation of the sense amplifier 280. The first power supply voltage VINTA1, the ground voltage VSS and the pre-charge voltage VBL may be included in a first driving voltage set. The sense amplifying circuit 280 may sequential the first bit and the second bit of the multi-bit data stored in the memory cell MC. In some embodiments, VINTA1 is an example of a first power supply voltage of the first driving voltage set.

One end of the PMOS transistor P11 is connected to a line of the first sensing signal node LA1, the other end of the PMOS transistor P11 is connected to a first sensing bit-line SBL1, and a gate of the first PMOS transistor P11 is connected to a first complementary sensing bit-line SBLB1. One end of the PMOS transistor P12 is connected to the line of the first sensing signal node LA1, the other end of the second PMOS transistor P12 is connected to the first complementary sensing bit-line SBLB1, and a gate of the PMOS transistor P12 is connected to the first sensing bit-line SBL1. One end of the NMOS transistor N11 is connected to the power switch SW10, the other end of the NMOS transistor N11 is connected to the first sensing bit-line SBL1, and a gate of the first NMOS transistor N11 is connected to a holding bit-line HBL. One end of the second NMOS transistor N12 is connected to the power switch SW10, the other end of the NMOS transistor N12 is connected to the first complementary sensing bit-line SBLB1, and a gate of the NMOS transistor N12 is connected to the complementary holding bit-line HBLB.

The bit-line switch SWa is connected between the bit-line BL and the holding bit-line HBL and is turned on or off in response to the control of the control logic circuit 210. The complementary bit-line switch SWb is connected between the complementary bit-line BLB and the complementary holding bit-line HBLB and is turned on or off in response to the control of the control logic circuit 210. The power switch SW10 is connected between one end of each of the NMOS transistors N11 and N12 and a line of the second sensing signal node LAB1 and is turned on or off in response to the control of the control logic circuit 210.

The first switch SW1 is connected between the holding bit-line HBL and the first sensing bit-line SBL1 and is turned on or off in response to the control of the control logic circuit 210. The second switch SW2 is connected between the complementary holding bit-line HBLB and the first complementary sensing bit-line SBLB1 and is turned on or off in response to the control of the control logic circuit 210. The third switch SW3 is connected between the holding bit-line HBL and the first complementary sensing bit-line SBLB1 and is turned on or off in response to the control of the control logic circuit 210. The fourth switch SW4 is connected between the complementary holding bit-line HBLB and the first sensing bit-line SBL1 and is turned on or off in response to the control of the control logic circuit 210.

The latch circuit 283 is connected to a third sensing signal node LA2 and a fourth sensing signal node LAB2 and includes PMOS transistors P21 and P22 and NMOS transistors N21 and N22. A second power supply voltage VINTA2, the ground voltage VSS, and a negative voltage VBB or the pre-charge voltage VBL may be applied to each of the third and fourth sensing signal nodes LA2 and LAB2 in accordance with control of the control logic circuit 210 for controlling an operation of the sense amplifier 280. The second power supply voltage VINTA2, the ground voltage VSS, and the negative voltage VBB or the pre-charge voltage VBL may be included in a second driving voltage set. In some embodiments, VINTA2 is a second power supply voltage of the second driving voltage set. The latch circuit 283 may receive the first bit sensed by the sense amplifying circuit 281 and may store the received first bit.

One end of the PMOS transistor P21 is connected to a line of the third sensing signal node LA2, the other end of the PMOS transistor P21 is connected to a second sensing bit-line SBL2, and a gate of the PMOS transistor P21 is connected to the second complementary sensing bit-line SBLB2. One end of the PMOS transistor P22 is connected to the line of the third sensing signal node LA2, the other end of the PMOS transistor P22 is connected to the second complementary sensing bit-line SBLB2, and a gate of the PMOS transistor P22 is connected to the second sensing bit-line SBL2. One end of the NMOS transistor N21 is connected to a line of the fourth sensing signal node LAB2, the other end of the third NMOS transistor N21 is connected to the second sensing bit-line SBL2, and a gate of the third NMOS transistor N21 is connected to the second complementary sensing bit-line SBLB2. One end of the NMOS transistor N22 is connected to the line of the fourth sensing signal node LAB2, the other end of the NMOS transistor N22 is connected to the second complementary sensing bit-line SBLB2, and a gate of the NMOS transistor N22 is connected to the second sensing bit-line SBL2.

The fifth switch SW5 is connected between the first sensing bit-line SBL1 and the second sensing bit-line SBL2 and is turned on or off in response to the control of the control logic circuit 210. The sixth switch SW6 is connected between the first complementary sensing bit-line SBLB1 and the second complementary sensing bit-line SBLB2 and is turned on or off in response to the control of the control logic circuit 210.

Figure 6:
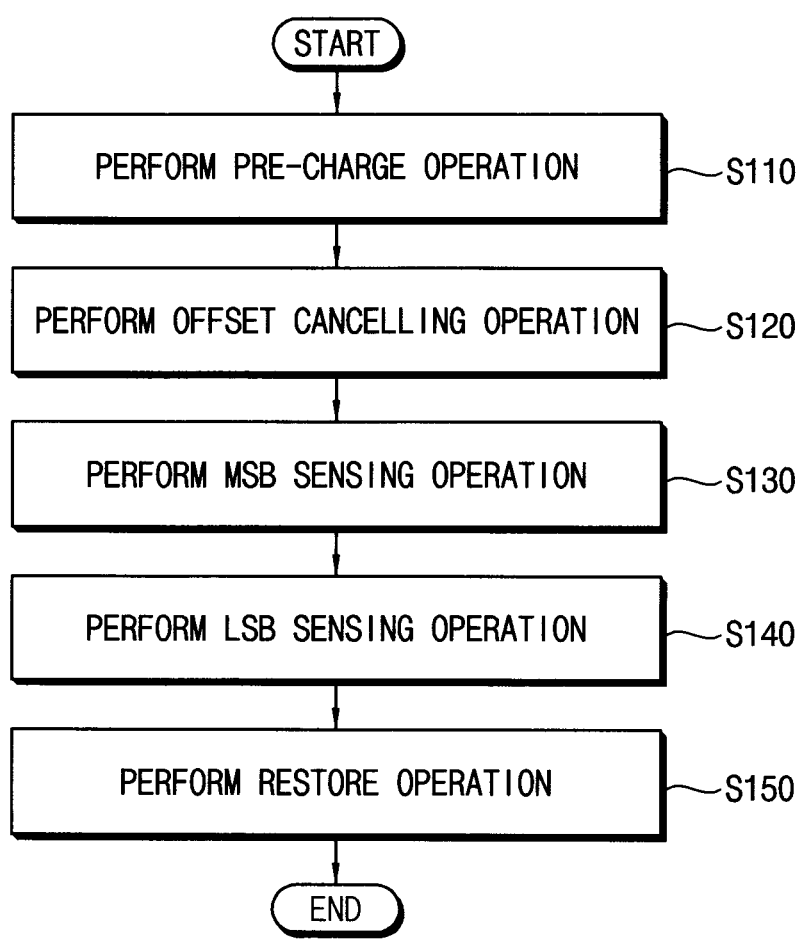
FIG. 6 is a flowchart conceptually illustrating an operation of the sense amplifier of FIG. 5.

FIG. 6 is a flowchart conceptually illustrating an operation of the sense amplifier of FIG. 5.

Referring to FIG. 6, in operation S110, the sense amplifier 280 performs a pre-charging operation. The sense amplifier 280 pre-charges the bit-line BL, the holding bit-line HBL, the complementary bit-line BLB, the complementary holding bit-line HBLB, the first sensing bit-line SBL1, the first complementary sensing bit-line SBLB1, the second sensing bit-line SBL2, the second complementary sensing bit-line SBLB2, the first and second sensing driving signals LA1 and LAB1, and the third and fourth sensing driving signals LA2 and LAB2 to the pre-charge voltage VBL.

In operation S120, the sense amplifier 280 performs the offset removing operation. In the sense amplifier 280 having the open bit-line structure illustrated in FIG. 3, noise that results from, for example process variations, temperatures, or differences in threshold voltage between transistors may vary in the pair of bit-lines BL and BLB. The noise of the pair of bit-lines BL and BLB may operate as offset noise during a sense operation of the sense amplifier 280 and may reduce a valid sensing margin of the sense amplifier 280. Therefore, the sense amplifier 280 may be configured to perform the offset removing operation before the sense operation in order to increase the valid sensing margin.

In operation S130, the sense amplifier 280 senses the MSB (the first bit) of the 2-bit combination represented by the cell voltage Vcell stored in the memory cell MC. The MSB sense operation may include the first charge sharing operation, which may include charge sharing generated between the charges stored in the memory cell MC and the charges stored in the bit-line BL and the holding bit-line HBL.

The sense amplifier 280 sense amplifies a difference between the MSB voltage $V_{MSB}$ of the bit-line BL and the holding bit-line HBL and the complementary bit-line voltage $V_{BLB}$ of the complementary bit-line BLB and may latch the MSB of logic "1" or logic "0", respectively having a level of the first power supply voltage VINTA1 or the ground voltage VSS.

In operation S540, the sense amplifier 280 may sense the LSB (the second bit) of the 2-bit combination represented by the cell voltage Vcell stored in the memory cell MC. The LSB sense operation may include the second charge sharing operation.

The sense amplifier 280 sense amplifies a difference between the LSB voltage $V_{LSB}$ of the bit-line BL and the holding bit-line HBL and the complementary bit-line voltage $V_{BLB}$ of the complementary holding bit-line HBLB and may latch the LSB of logic "1" or logic "0", respectively having the level of the first power voltage VINTA1 or the ground voltage VSS.

In operation S550, the sense amplifier 280 performs the restoring operation of rewriting to the memory cell MC the cell voltage Vcell generated by the combination of the sensed MSB and LSB. The restoring operation may include the third charge sharing operation.

By the sense operations S130 and S140 of the MSB and LSB, the LSB of a corresponding logic level is stored in the bit-line BL and the holding bit-line HBL, and the MSB of a corresponding logic level is stored in the first sensing bit-line SBL1, the complementary bit-line BLB, the complementary holding bit-line HBLB, and the first complementary sensing bit-line SBLB1.

The third charge sharing operation may be performed by using the cell capacitance of the memory cell MC, the bit-line capacitance of each of the pair of bit-lines BL and BLB, the bit-line capacitance of each of the pair of holding bit-lines HBL and HBLB, the bit-line capacitance of each of the first pair of sensing bit-lines SBL1 and SBLB1, and a change in capacitances. The sensed MSB and LSB may be combined by the third charge sharing operation. The sense amplifier 280 may restore in the memory cell MC the cell voltage Vcell generated by the combination of the sensed MSB.

FIGS. 7A to 7K are equivalent circuits illustrating an operation of the sense amplifier of FIG. 5.

Figure 7B:
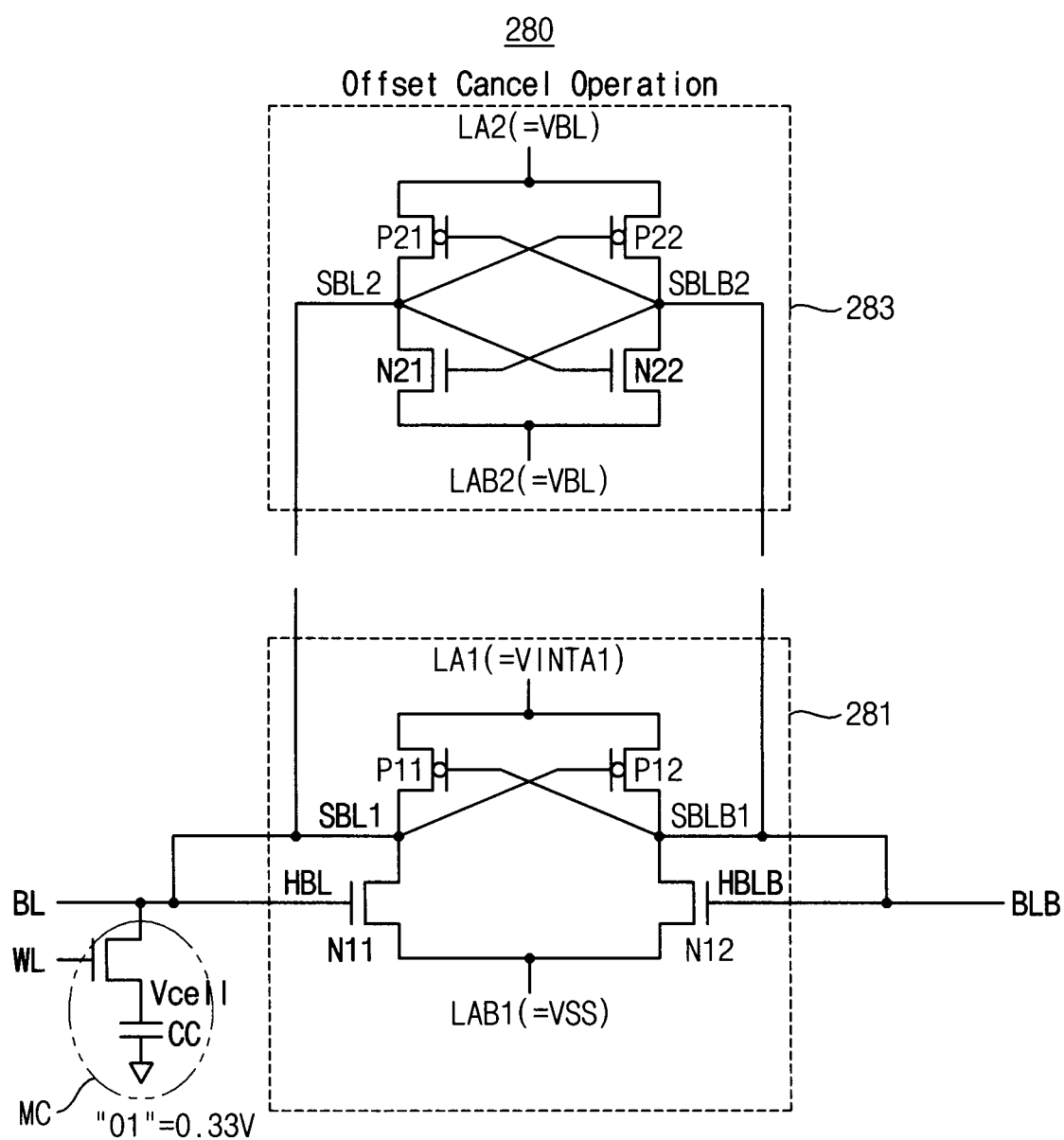
Figure 7C:
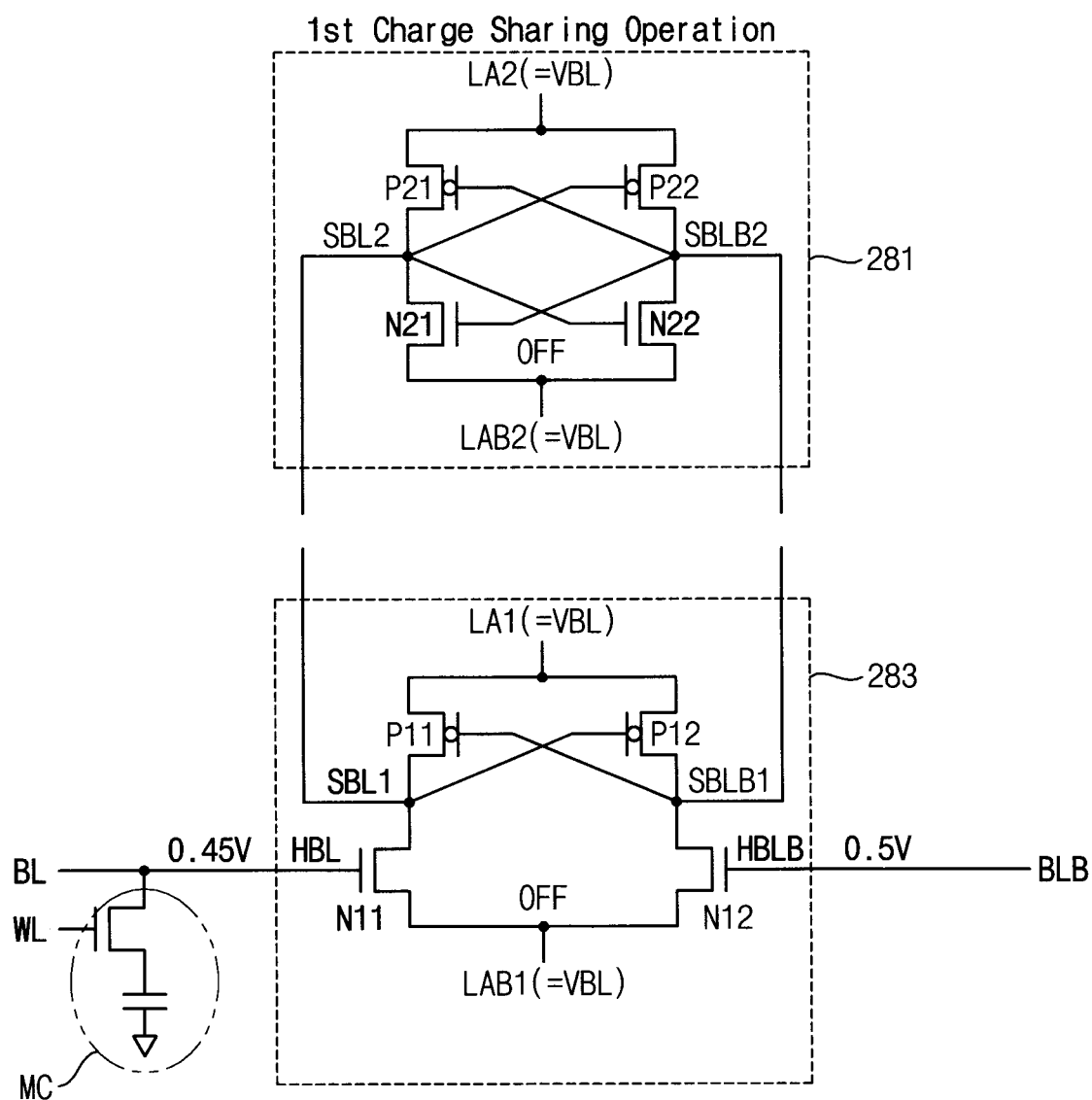
Figure 7D:
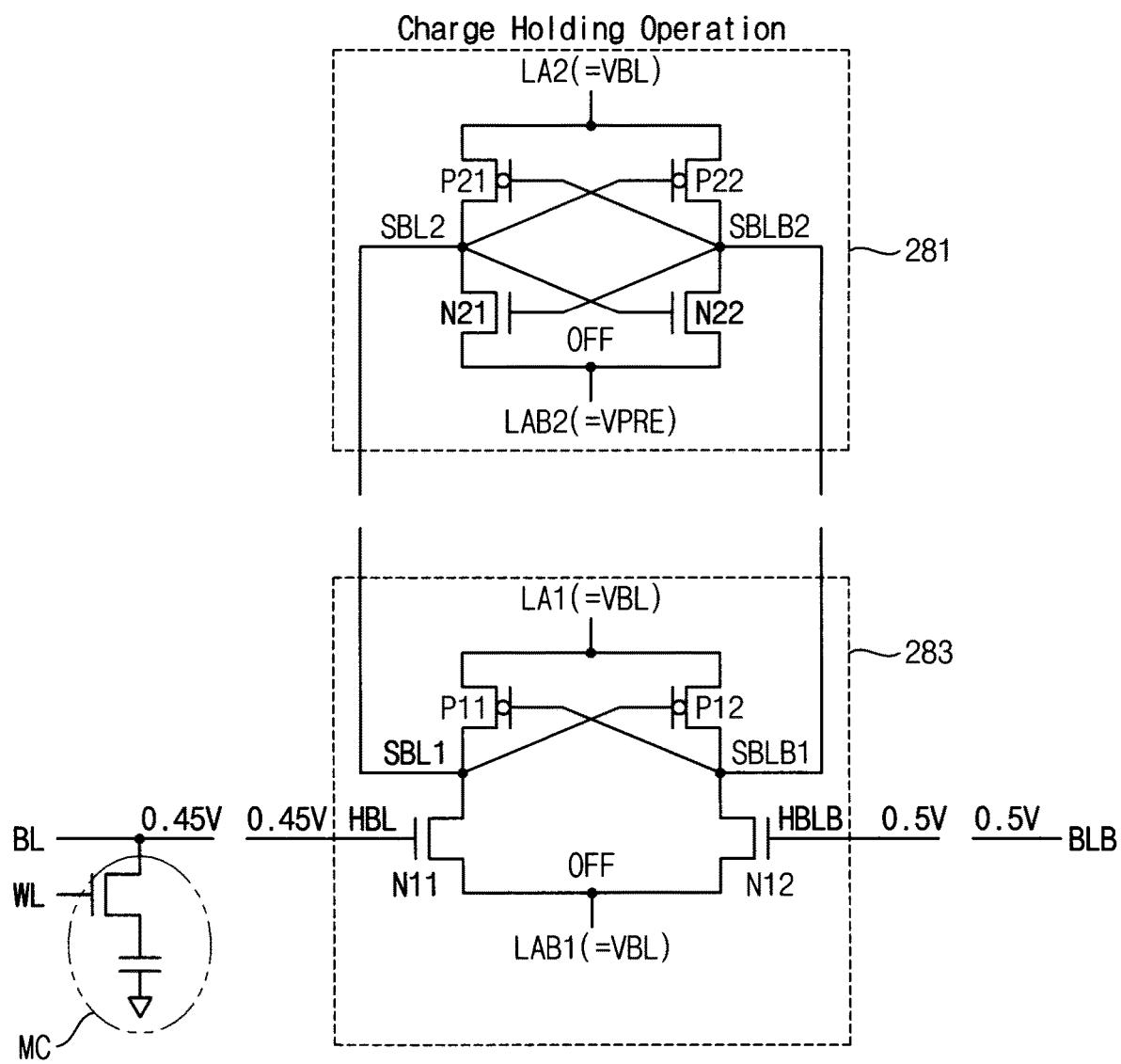
Figure 7E:
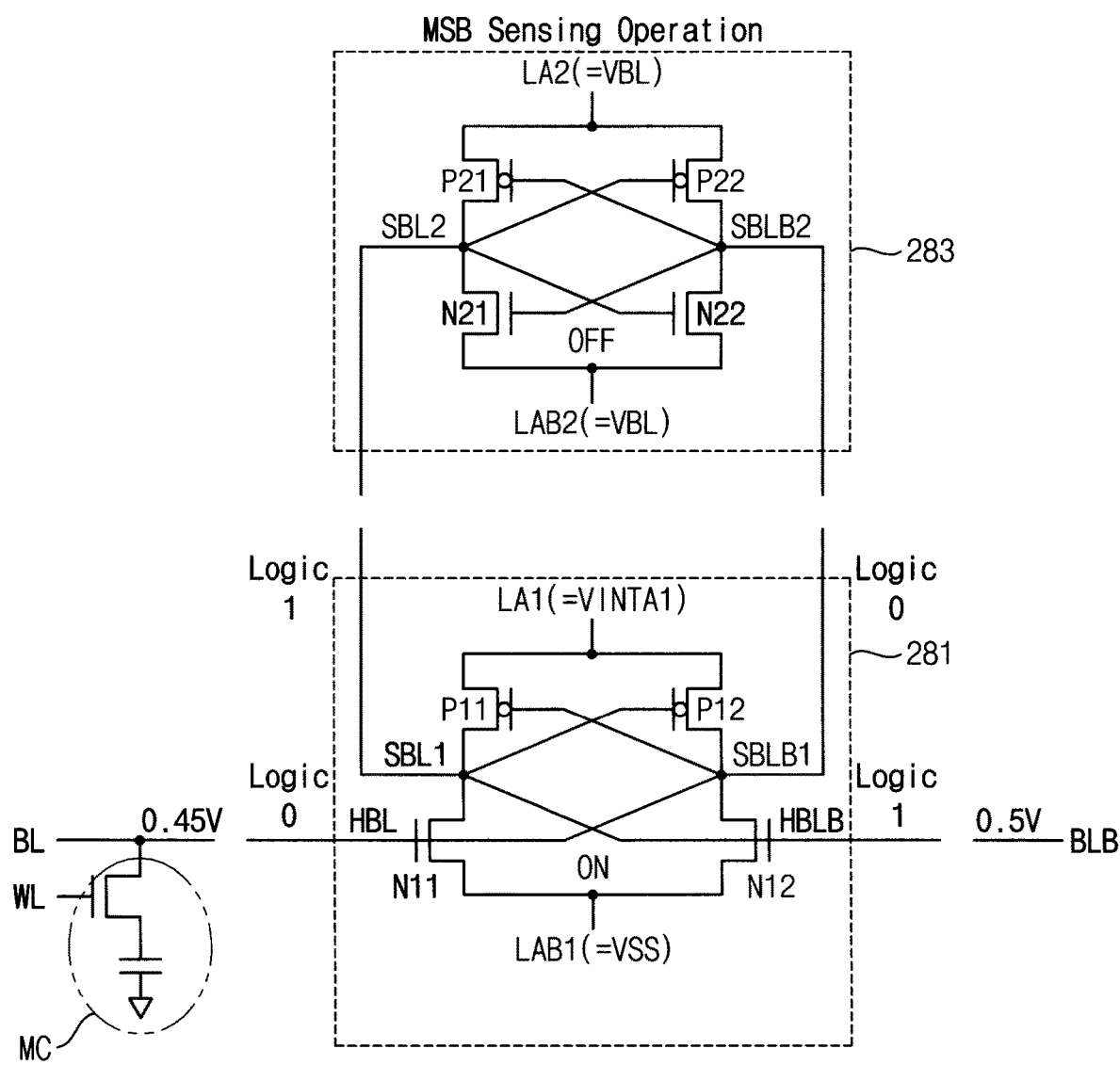
Figure 7F:
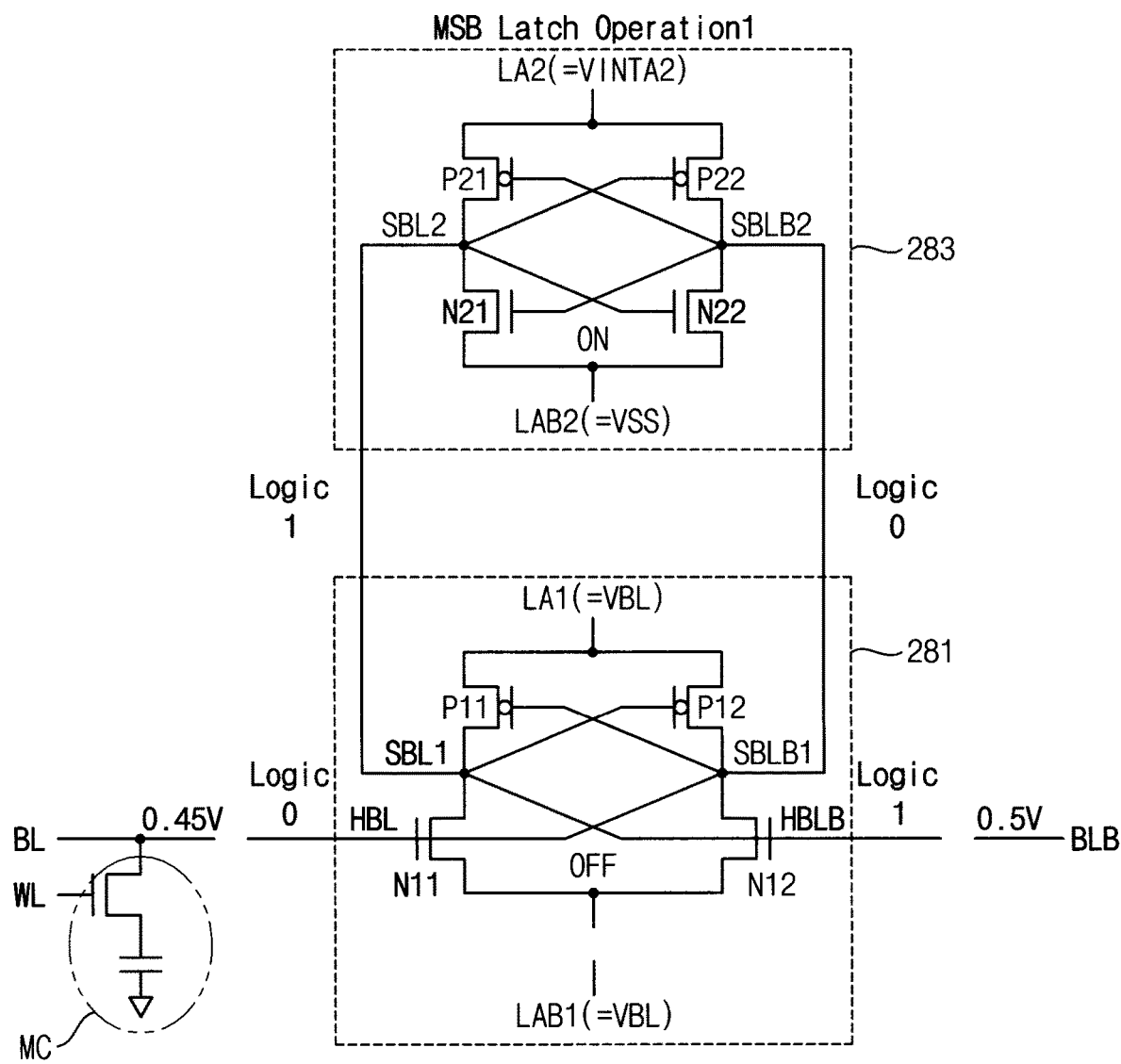
Figure 7G:
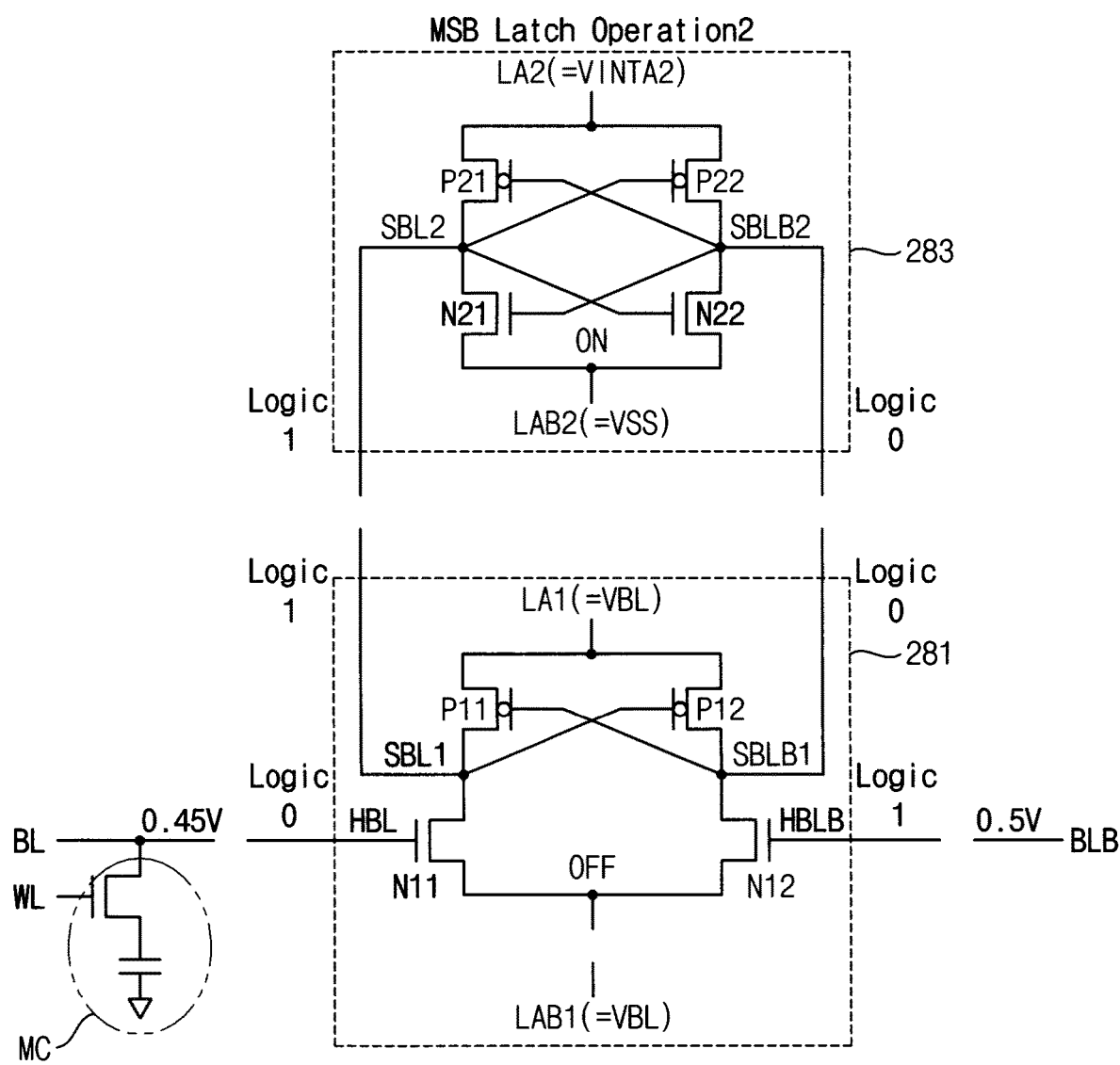
Figure 7H:
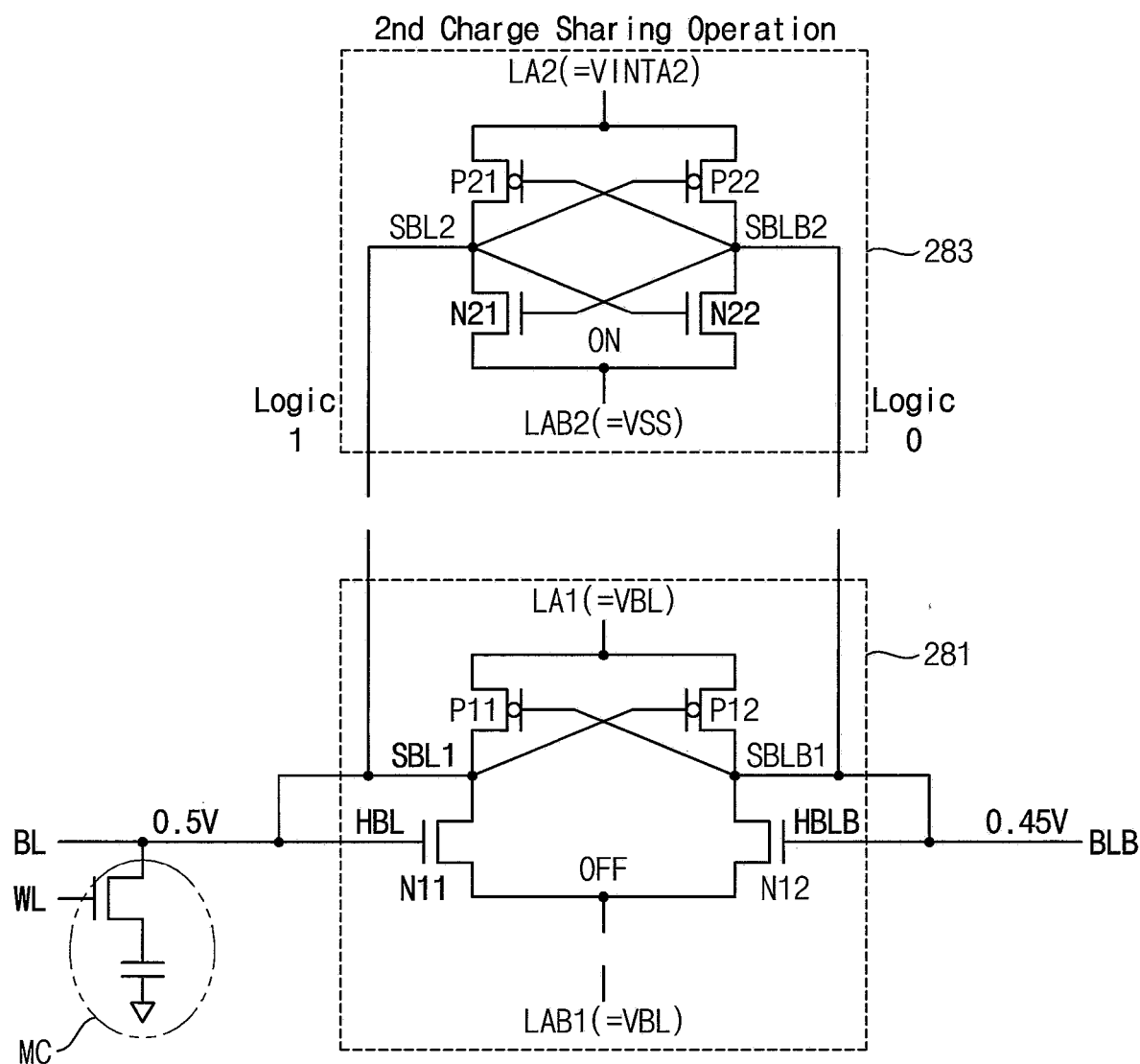
Figure 7I:
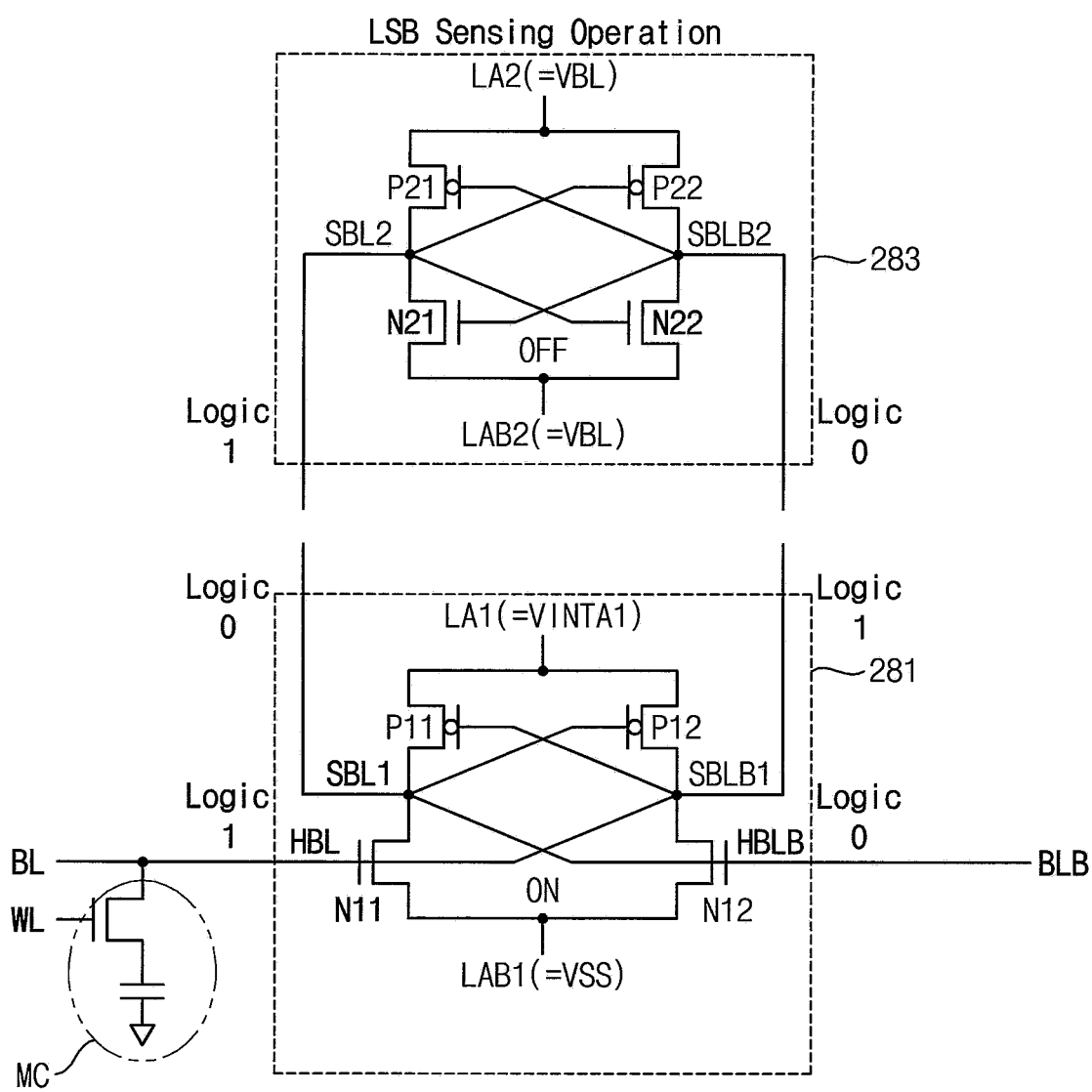
Figure 7J:
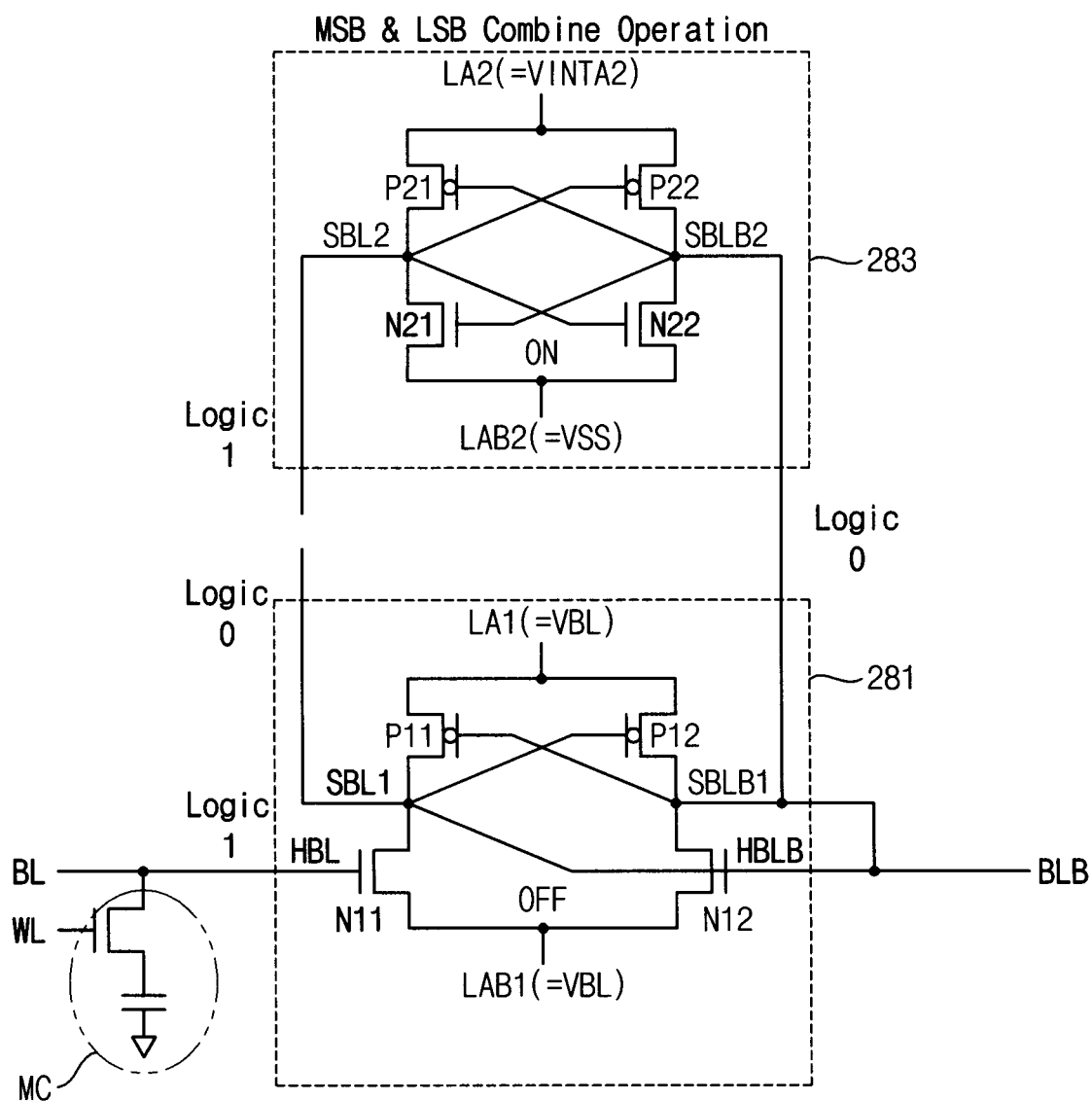
Figure 7K:
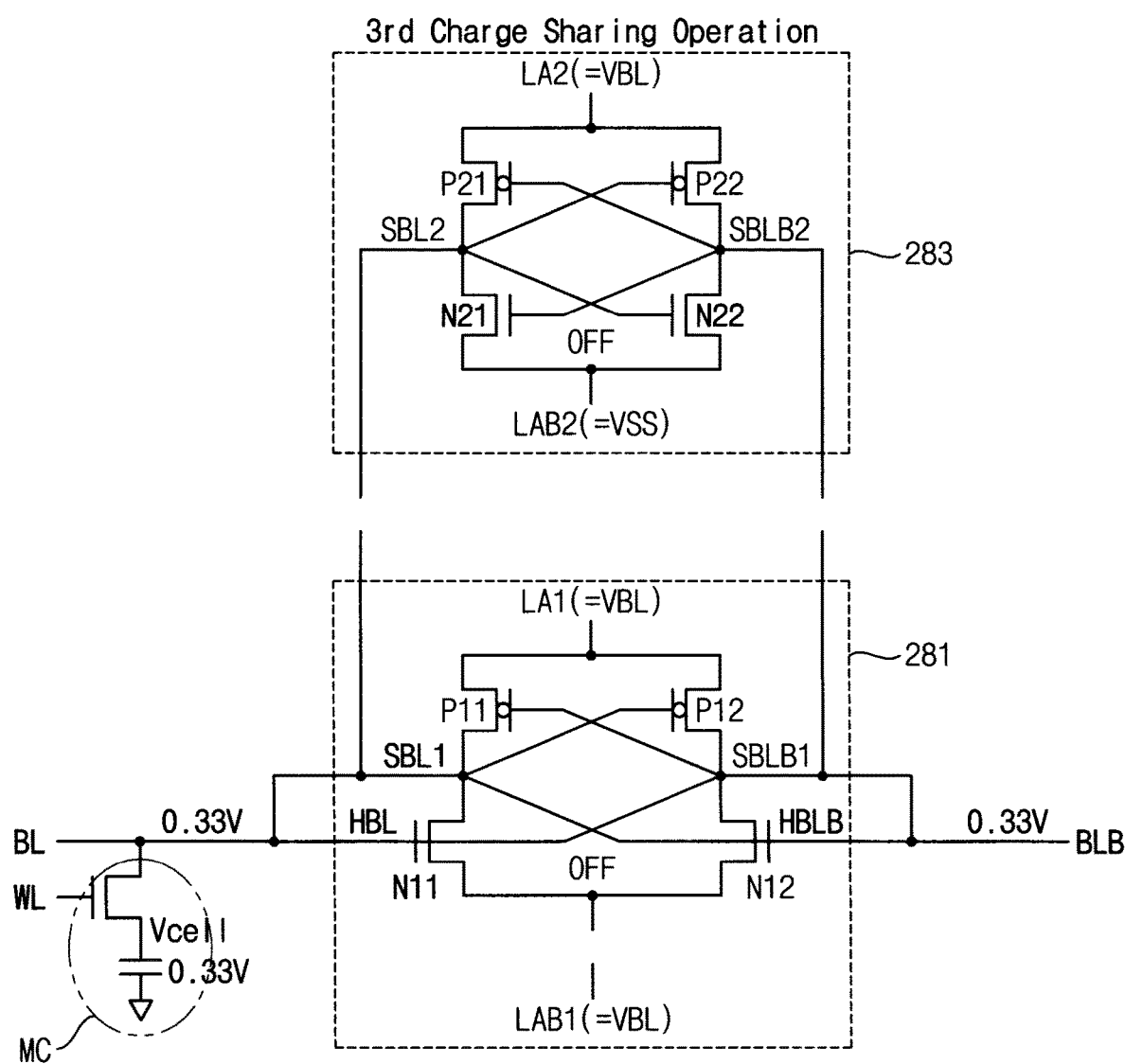
Figure 8:
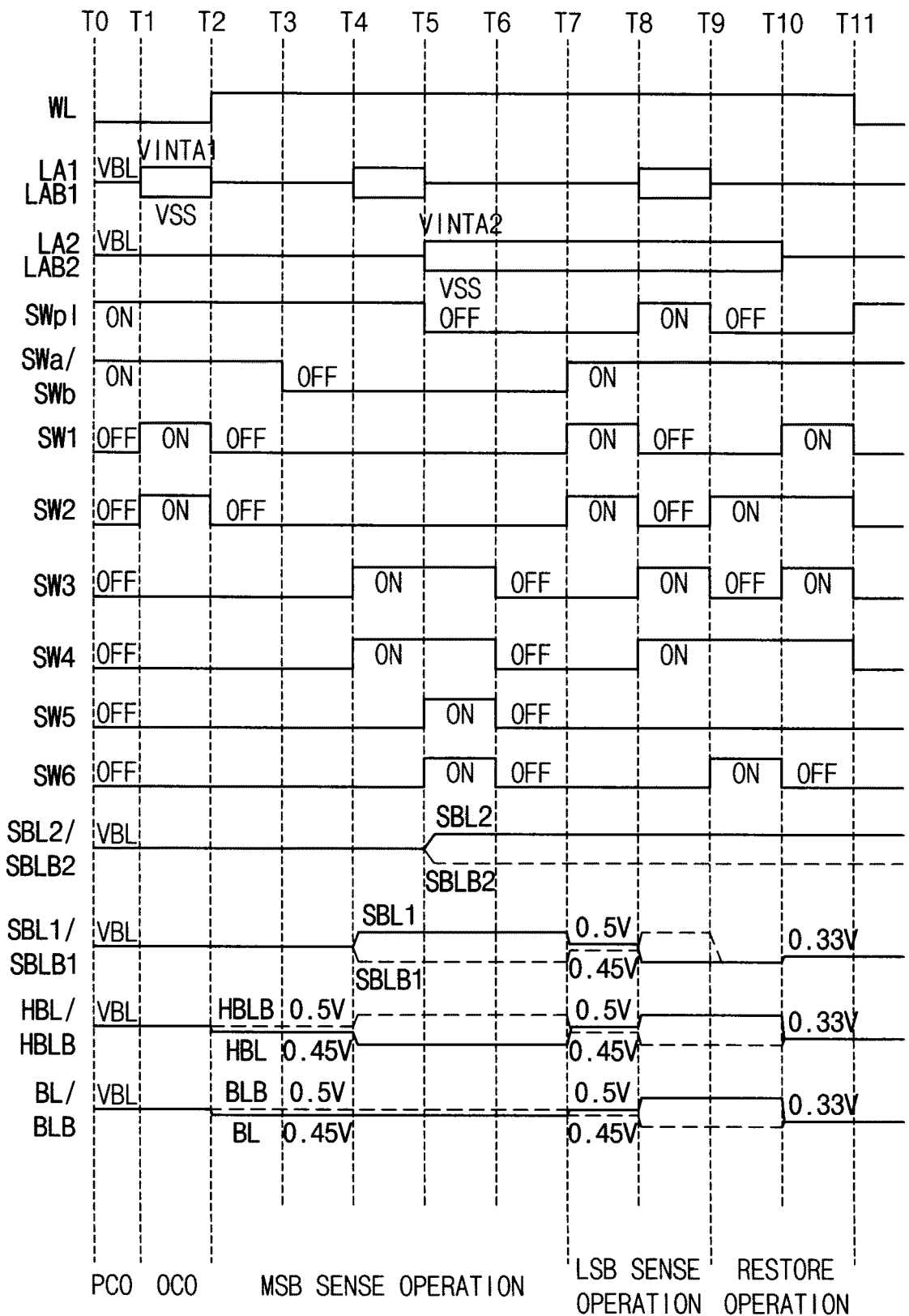
FIG. 8 is a timing diagram according to operations of the equivalent circuits illustrated in FIGS. 7A to 7K.

FIG. 8 is a timing diagram according to operations of the equivalent circuits illustrated in FIGS. 7A to 7K.

To simplify the illustrations, switches that are turned on in FIGS. 7A through 7K are illustrated as short circuits and switches that are being turned off are illustrated as being open. FIGS. 7A to 7K illustrate an operation of the sense amplifier for sensing the cell voltage Vcell of 0.33 V stored in the memory cell MC, that is, the 2-bit data "01".

Pre-Charge Operation

Referring to FIG. 7A and the point in time T0 of FIG. 8, the sense amplifier 280 pre-charges the bit-line BL, the holding bit-line HBL, the complementary bit-line BLB, the complementary holding bit-line HBLB, the first sensing bit-line SBL1, the first complementary sensing bit-line SBLB1, the second sensing bit-line SBL2, the second complementary sensing bit-line SBLB2, the first and second sensing signal nodes LA1 and LAB1, and the third and fourth sensing signal nodes LA2 and LAB2 to the pre-charge voltage VBL.

For example, the bit-line BL and the complementary bit-line BLB may be charged to the pre-charge voltage VBL in the equalizing circuit 160 in FIG. 2. In the pre-charge operation, the sense amplifying circuit 281 and the latch circuit 283 are in off states, the bit-line switch SWa, the complementary bit-line switch SWb, and the power switch SW10 are in on states, and the first to sixth switches SW1 to SW6 are in off states. Hereinafter, when the sense amplifying circuit 281 is in the off state, the pre-charge voltage VBL is applied to the first and second sensing signal nodes LA1 and LAB1 and, when the latch circuit 283 is in the off state, the pre-charge voltage VBL is applied to the third and fourth sensing signal nodes LA2 and LAB2.

Offset Removing Operation

Referring to FIG. 7B and the point in time T1 of FIG. 8, the sense amplifier 280 performs the offset removing operation. In order to increase the valid sensing margin of the sense amplifier 280, the sense amplifier 280 turns on the sense amplifying circuit 281 and turns on the first and second switches SW1 and SW2 to perform the offset removing operation. The first power supply voltage VINTA1 is applied to the first sensing signal node LA1 of the sense amplifying circuit 281 and the ground voltage VSS is applied to the second sensing signal node LAB1.

In the sense amplifying circuit 281, the complementary bit-line BLB is increased or reduced to a prescribed level in comparison with the bit-line BL by the offset noise of the pair of bit-lines BL and BLB and accordingly, a prescribed voltage difference lies between the bit-line BL and the complementary bit-line BLB. The voltage difference may be interpreted as the offset voltage in accordance with the offset noise, which means that the bit-line BL and the complementary bit-line BLB are set to have a difference by the offset voltage and accordingly, the offset noise of the sense amplifier 280 is removed. That is, the sense amplifier 280 may compensate for offset through the offset removing operation.

First Charge Sharing Operation

Referring to FIG. 7C and the point in time T2 of FIG. 8, the sense amplifier 280 performs the first charge sharing operation between the memory cell MC and the bit-line BL. The sense amplifier 280 turns off the sense amplifying circuit 281 and the first and second switches SW1 and SW2. At this time, the word-line WL connected to the memory cell MC is enabled and charge sharing is generated between the charges stored in the capacitor of the memory cell MC and the charges stored in the bit-line BL and the holding bit-line HBL.

When the cell voltage Vcell of 0.33 V is stored in the memory cell MC, during the charge sharing operation, the voltage level of each of the bit-line BL and the holding bit-line HBL is reduced by a prescribed level from the level of the pre-charge voltage VBL. That is, the voltage level of each of the bit-line BL and the holding bit-line HBL is reduced from 0.5 V to about 0.45 V. At this time, each of the complementary bit-line BLB and the complementary holding bit-line HBLB maintains the level of the pre-charge voltage VBL, that is, 0.5 V.

Charge Holding Operation

Referring to FIG. 7D and the point in time T3 of FIG. 8, the sense amplifier 280 holds the charges of the bit-line BL and the holding bit-line HBL in accordance with the first charge sharing operation. The sense amplifier 2800 turns off the bit-line switch SWa and the complementary bit-line switch SWb. Each of the bit-line BL and the holding bit-line HBL maintains the voltage level of about 0.45 V and each of the complementary bit-line BLB and the complementary holding bit-line HBLB maintains the voltage level of about 0.5 V.

MSB Sense Operation

Referring to FIG. 7E and the point in time T4 of FIG. 8, the sense amplifier 280 performs the MSB sense operation of sensing the MSB of the 2-bit combination represented by the cell voltage Vcell stored in the memory cell MC. The sense amplifier 280 turns on the sense amplifying circuit 281 and the third and fourth switches SW3 and SW4 to perform the MSB sense operation. The first power supply voltage VINTA1 is applied to the first sensing signal node LA1 of the sense amplifying circuit 281 and the ground voltage VSS is applied to the second sensing signal node LAB1. In the example of FIG. 7E, the margin of the sense amplifying circuit 281 is VINTA1 minus VSS (VINTA1–VSS). The holding bit-line HBL and the first complementary sensing bit-line SBLB1 are connected by the third switch SW3 and the complementary holding bit-line HBLB and the first sensing bit-line SBL1 are connected by the fourth switch SW4.

The sense amplifying circuit 281 may increase the voltage of the first sensing bit-line SBL1 to the logic "1" level and may reduce the voltage of the first complementary sensing bit-line SBLB1 to the logic "0" level by sensing the MSB of the 2-bit combination based on a difference between a holding bit-line HBL voltage of 0.45 V and a complementary holding bit-line HBLB voltage of 0.5 V that are respectively applied to gates of the NMOS transistors N11 and N12. The voltage of the complementary holding bit-line HBLB connected to the first sensing bit-line SBL1 is increased to the logic "1" level and the voltage of the holding bit-line HBL connected to the first complementary sensing bit-line SBLB1 is reduced to the logic "0" level.

First MSB Latching Operation

Referring to FIG. 7F and the point in time T5 of FIG. 8, the sense amplifier 280 performs the first MSB latching operation of latching the MSB of the 2-bit data. The sense amplifier 281 performs the first MSB latching operation by turning off the sense amplifying circuit 281, turning on the latch circuit 283, turning off the power switch SW10, and turning on the fifth and sixth switches SW5 and SW6. The second power voltage VINTA2 is applied to the third sensing signal node LA2 of the latch circuit 283 and the ground voltage VSS is applied to the fourth sensing signal node LAB2. The first sensing bit-line SBL1 and the second sensing bit-line SBL2 are connected by the fifth switch SW5 and the first complementary sensing bit-line SBLB1 and the second complementary sensing bit-line SBLB2 are connected by the sixth switch SW6. The power switch SWpl may be turned off in order to block a leakage current path that prohibits operation of the latch circuit 283 in an on state.

The latch circuit 283 may increase the voltage of the second sensing bit-line SBL2 to the logic "1" level and may reduce the voltage of the second complementary sensing bit-line SBLB2 to the logic "0" level by sensing the 2-bit combination MSB based on a voltage difference between the second sensing bit-line SBL2 and the second complementary sensing bit-line SBLB2. The voltage of each of the first sensing bit-line SBL1 and the complementary holding bit-line HBLB connected to the second sensing bit-line SBL2 is at the logic "1" level. The voltage of each of the first complementary sensing bit-line SBLB1 and the holding bit-line HBL connected to the second complementary sensing bit-line SBLB2 is at the logic "0" level.

After the MSB latch operation, a charge on the line between SBLB2 and SBLB1 represents information indicating the logical value of the MSB. That is, the charge is different if the MSB is a logical 1 or a logical 0.

Second MSB Latching Operation

Referring to FIG. 7G and the point in time T6 of FIG. 8, the sense amplifier 280 performs the second MSB latching operation. The sense amplifier 280 performs the second MSB latching operation by turning off the third to sixth switches SW3 to SW6. The voltage of the second sensing bit-line SBL2 maintains the logic "1" level, the voltage of the second complementary sensing bit-line SBLB2 maintains the logic "0" level, the voltage of the first sensing bit-line SBL1 maintains the logic "1" level, the voltage of the first complementary sensing bit-line SBLB1 maintains the logic "0" level, the voltage of the holding bit-line HBL maintains the logic "0" level, and the voltage of the complementary holding bit-line HBLB maintains the logic "1" level. The logic "0" level may be latched to the second complementary sensing bit-line SBLB2 of the latch circuit 283 as the MSB of the memory cell MC.

Second Charge Sharing Operation

Referring to FIG. 7H and the point in time T7 of FIG. 8, the sense amplifier 280 performs the second charge sharing operation among the first sensing bit-line SBL1, the holding bit-line HBL, and the bit-line BL and among the first complementary sensing bit-line SBLB1, the complementary holding bit-line HBLB, and the complementary bit-line BLB. The sense amplifier 280 turns on the bit-line switch SWa, the complementary bit-line switch SWb, and the first and second switches SW1 and SW2.

The bit-line BL, the holding bit-line HBL, and the first sensing bit-line SBL1 are connected by the bit-line switch SWa and the first switch SW1. The complementary bit-line BLB, the complementary holding bit-line HBLB, and the first complementary sensing bit-line SBLB1 are connected by the complementary bit-line switch SWb and the second switch SW2.

Charge sharing occurs among the charges stored in the bit-line BL, the charges stored in the holding bit-line HBL, and the charges stored in the first sensing bit-line SBL1. Charge sharing also occurs among the charges stored in the complementary bit-line BLB, the charges stored in the complementary holding bit-line HBLB, and the charges stored in the first complementary sensing bit-line SBLB1.

In the second charge sharing operation, the voltage of each of the bit-line BL, the holding bit-line HBL, and the first sensing bit-line SBL1 is captured as about 0.5 V and the voltage of each of the complementary bit-line BLB, the complementary holding bit-line HBLB, and the first complementary sensing bit-line SBLB1 is captured as about 0.45 V.

The sense amplifying circuit 281 starting at time T7 of FIG. 8 is not in an active set because LA1 and LAB1 are both set to the same voltage, VBL. Charge sharing occurs as described above, and the charge state of HBL and HBLB corresponds to the LSB. That is the charge state of HBL and HBLB is different if the LSB is a logical one or a logical zero.

LSB Sense Operation

Referring to FIG. 7I and the point in time T8 of FIG. 8, the sense amplifier 280 performs the LSB sense operation of sensing the LSB of the 2-bit combination represented by the cell voltage Vcell stored in the memory cell MC. The sense amplifier 280 performs the LSB sense operation by turning on the sense amplifying circuit 281 and the power switch SWpl, turning off the first and second switches SW1 and SW2, and turning on the third and fourth switches SW3 and SW4.

The first power voltage VINTA1 is applied to the first sensing signal node LA1 of the sense amplifying circuit 281 and the ground voltage VSS is applied to the second sensing signal node LAB1. The bit-line BL, the holding bit-line HBL, and the first complementary sensing bit-line SBLB1 are connected by the bit-line switch SWa and the third switch SW3. The complementary bit-line BLB, the complementary holding bit-line HBLB, and the first sensing bit-line SBL1 are connected by the complementary bit-line switch SWb and the fourth switch SW4.

The sense amplifying circuit 281 may decrease the voltage of the first sensing bit-line SBL1 to the logic "0" level and may increase the voltage of the first complementary sensing bit-line SBLB1 to the logic "1" level by sensing the 2-bit combination LSB based on a difference between a bit-line BL voltage of 0.5 V applied to each of gates of the PMOS and NMOS transistors P11 and N11 and a complementary bit-line BLB voltage of 0.45 V applied to each of gates of the PMOS and NMOS transistors P12 and N12.

The voltage of each of the complementary bit-line BLB and the complementary holding bit-line HBLB connected to the first sensing bit-line SBL1 is decreased to the logic "0" level and the voltage of each of the bit-line BL and the holding bit-line HBL connected to the first complementary sensing bit-line SBLB1 is increased to the logic "1" level. The logic "1" level may be latched to the bit-line BL of the sense amplifying circuit 281 as the LSB of the memory cell MC.

Starting at time T8 of FIG. 8 and as shown in FIG. 7I, sense amplifying circuit 281 is active as shown by LA1=VINTA1 and LAB1=VSS. The voltage state of the sense amplifying circuit 281 is then determined by the charge state established between times T7 and T8 as shown in FIG. 7H and discussed above.

Combining the MSB and the LSB

Referring to FIG. 7J and the point in time T9 of FIG. 8, the sense amplifier 280 may perform an operation of combining the sensed MSB and LSB of the memory cell MC. The sense amplifier 280 may combine the sensed MSB and LSB by turning off the sense amplifying circuit 281 and the power switch SWpl, turning on the second switch SW2, turning off the third switch SW3, and turning on the sixth switch SW6.

The MSB of the logic "0" level is latched to the second complementary sensing bit-line SBLB2 of the latch circuit 283 and the LSB of the logic "1" level is latched to the first complementary sensing bit-line SBLB1 of the sense amplifying circuit 281.

The second complementary sensing bit-line SBLB2, the first pair of sensing bit-lines SBL1 and SBLB1, the complementary holding bit-line HBLB, and the complementary bit-line BLB may be connected by the complementary bit-line switch SWb and the second, fourth, and sixth switches SW2, SW4, and SW6. The voltage of each of the first pair of sensing bit-lines SBL1 and SBLB1, the complementary holding bit-line HBLB, and the complementary bit-line BLB connected to the second complementary sensing bit-line SBLB2 is reduced to the logic "0" level. At this time, the voltage of each of the bit-line BL and the holding bit-line HBL maintains the logic "1" level.

Starting at time T9 of FIG. 8, SBLB2 of latch circuit 283 (related to the MSB) and SBLB1 of sense amplifying circuit 281 (related to the LSB) are conductively joined by the closure of switch SW6. See the circuit configuration of FIG. 7J. This begins the restore operation. The resulting charge affects SBL1 of the sense amplifying circuit 281 during the time interval T9 to T10 of FIG. 8.

Third Charge Sharing Operation

Referring to FIG. 7K and the point in time T10 of FIG. 8, the sense amplifier 280 performs the third charge sharing operation among the first pair of sensing bit-lines SBL1 and SBLB1, the pair of holding bit-lines HBL and HBLB, and the pair of bit-lines BL and BLB. The sense amplifier 280 may perform the third charge sharing operation by turning off the sense amplifying circuit 281, turning on the first and third switches SW1 and SW3, and turning off the sixth switch SW6. The pair of bit-lines BL and BLB, the pair of holding bit-lines HBL and HBLB, and the first pair of sensing bit-lines SBL1 and SBLB1 may be connected by the bit-line switch SWa, the complementary bit-line switch SWb, and the first to fourth switches SW1 to SW4.

The sense amplifier 280 may perform the third charge sharing operation by using the cell capacitance of the memory cell MC, the bit-line capacitance of each of the pair of bit-lines BL and BLB, the bit-line capacitance of each of the pair of holding bit-lines HBL and HBLB, the bit-line capacitance of each of the first pair of sensing bit-lines SBL1 and SBLB1, and a change in capacitances. In the third charge sharing operation, the voltage of each of the pair of bit-lines BL and BLB, the pair of holding bit-lines HBL and HBLB, and the first pair of sensing bit-lines SBL1 and SBLB1 have a level of about 0.33 V. The bit-line BL voltage is reduced to 0.33 V at the logic "1" level and the bit-line BL voltage of 0.33 V is restored in the memory cell MC as the cell voltage Vcell.

The sense amplifier 280 described above senses the cell voltage Vcell of 0.33 V, which is stored in the memory cell MC, as the MSB and LSB bits "01" and restores the bit-line BL voltage of 0.33 V corresponding to the sensed MSB and LSB bits "01" in the memory cell MC as the cell voltage Vcell.

Figure 20:
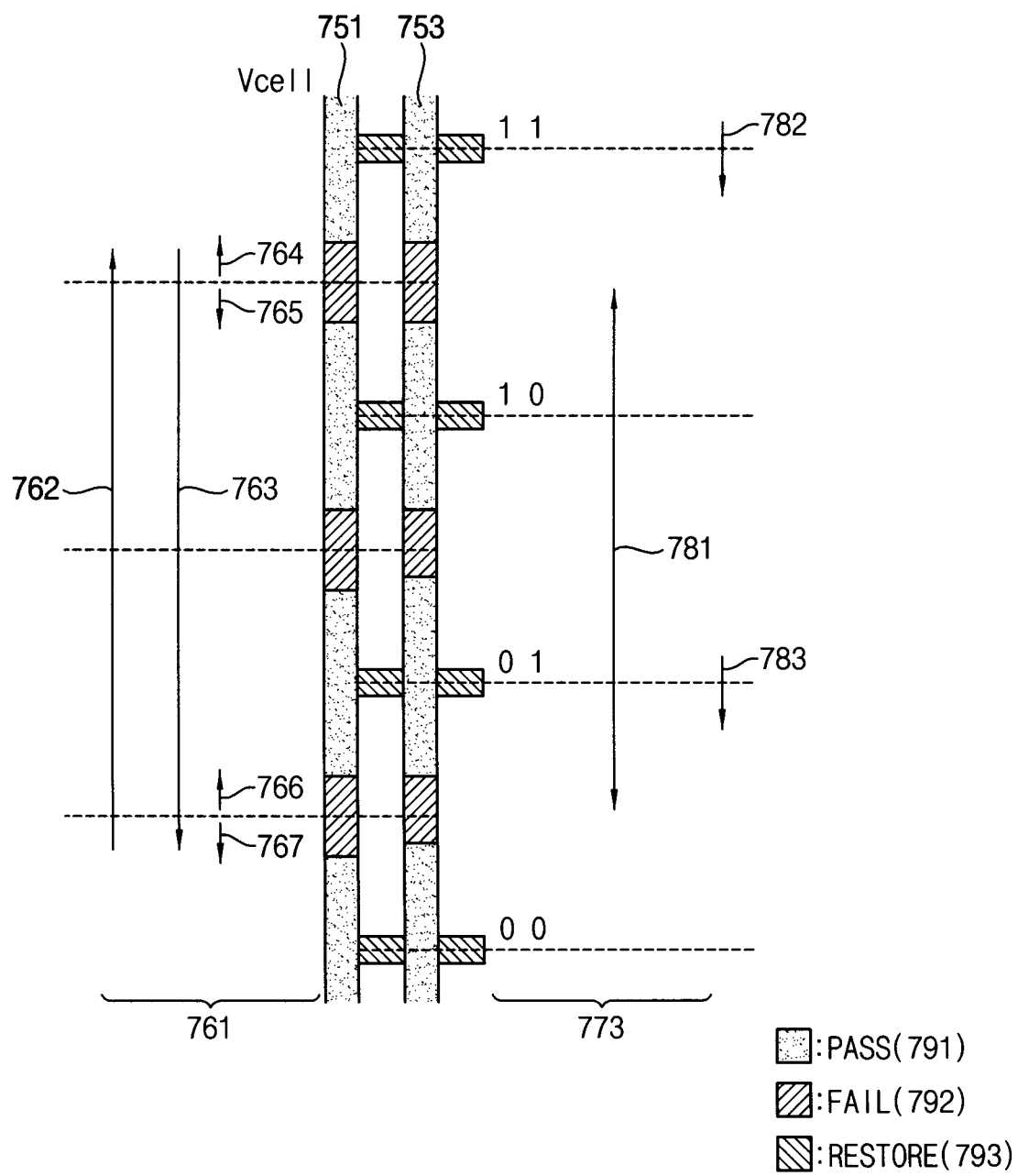
FIG. 20 illustrates tendency of error pattern based on change of the cell voltage in the semiconductor memory device of FIG. 2.

Thus, variations in the data which has been read from the memory cell MC (for example of FIG. 7A) are reduced as shown in FIG. 20 with cross-hatching marked "restore" 793 at the logical values 01 (just below the center on the right portion of FIG. 20).

Figure 9:
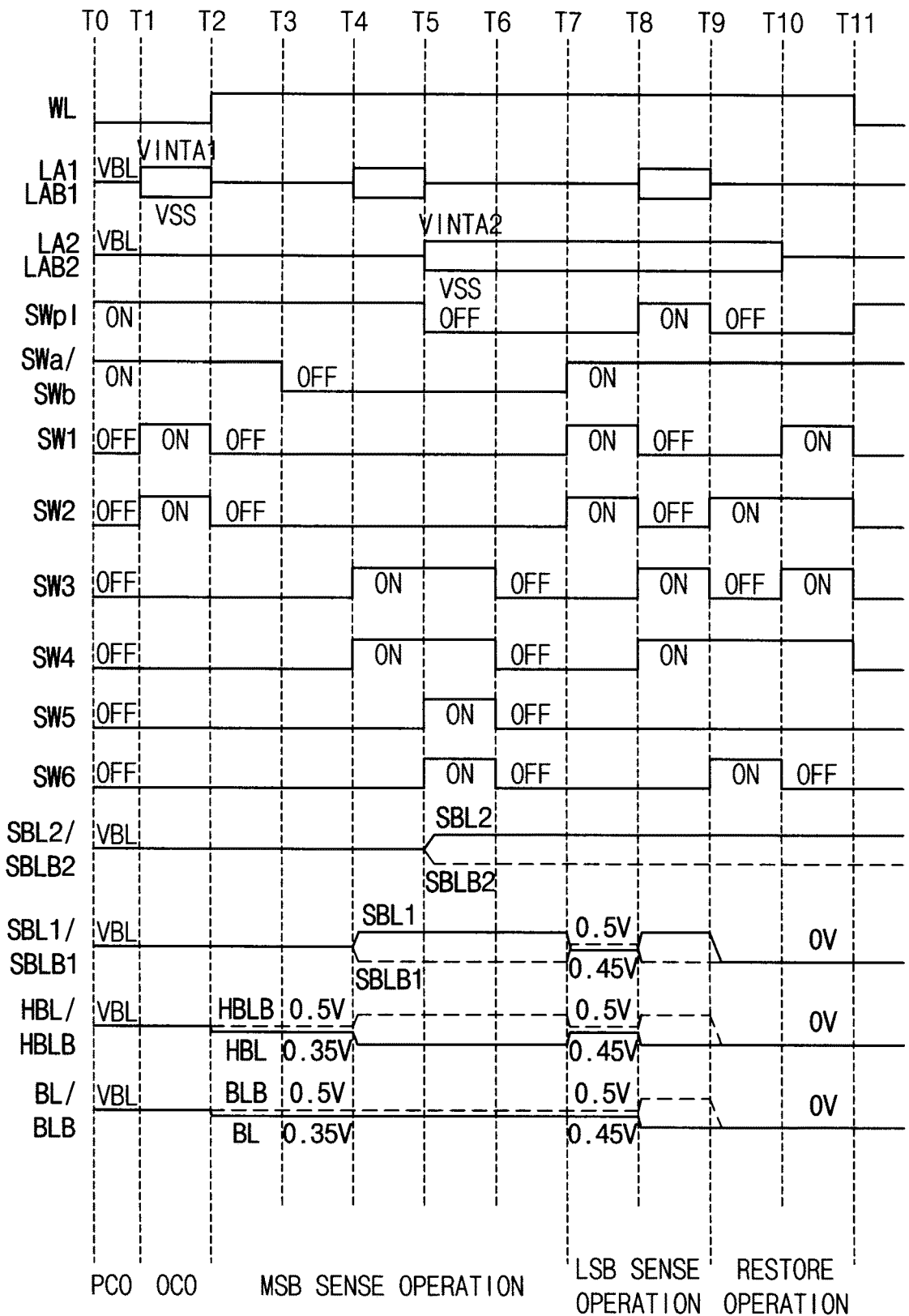
FIGS. 9 through 11 are timing diagrams for explaining operation of the sense amplifier to sense the multi-nit data stored in the memory cell, respectively.
Figure 10:
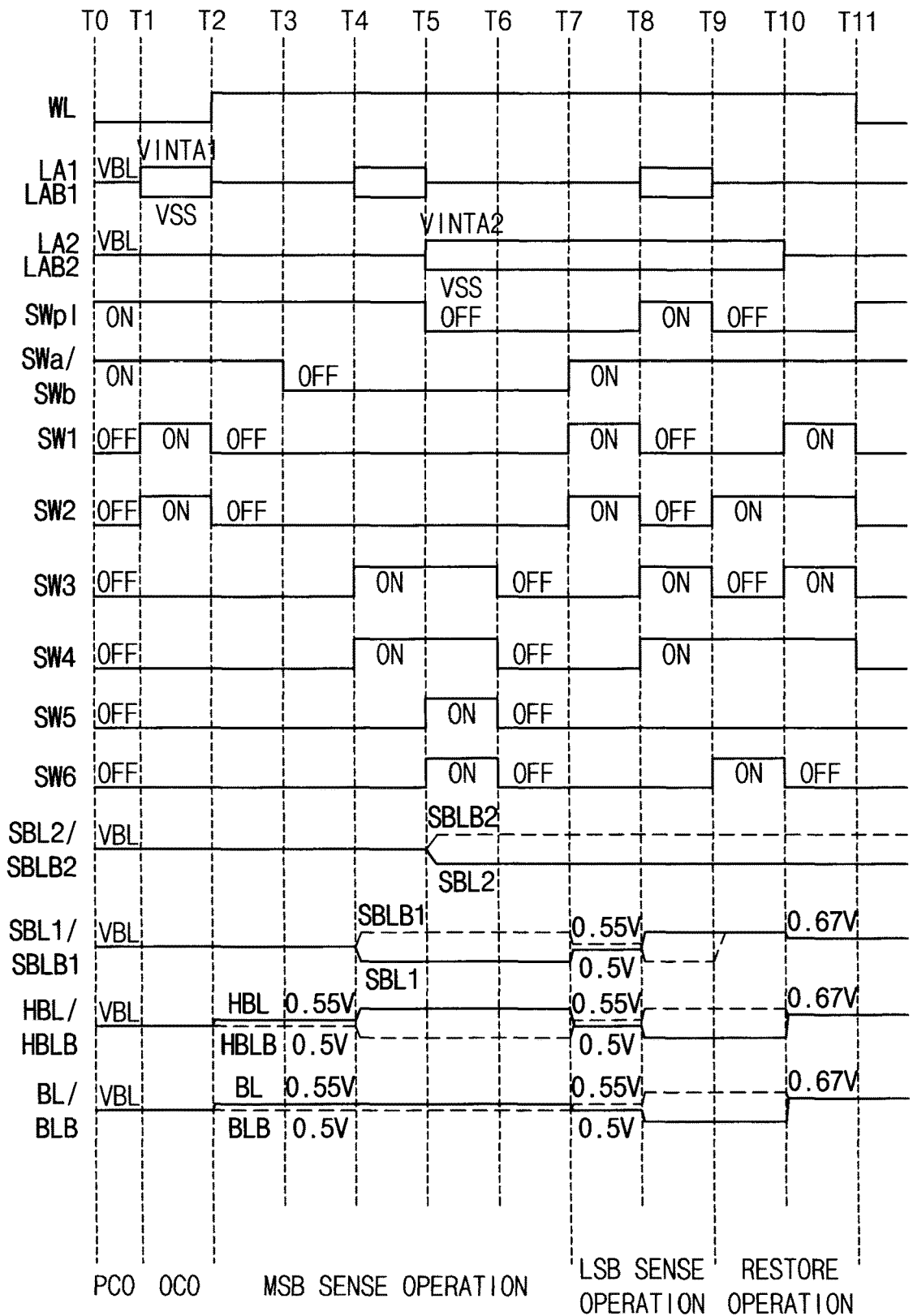
Figure 11:
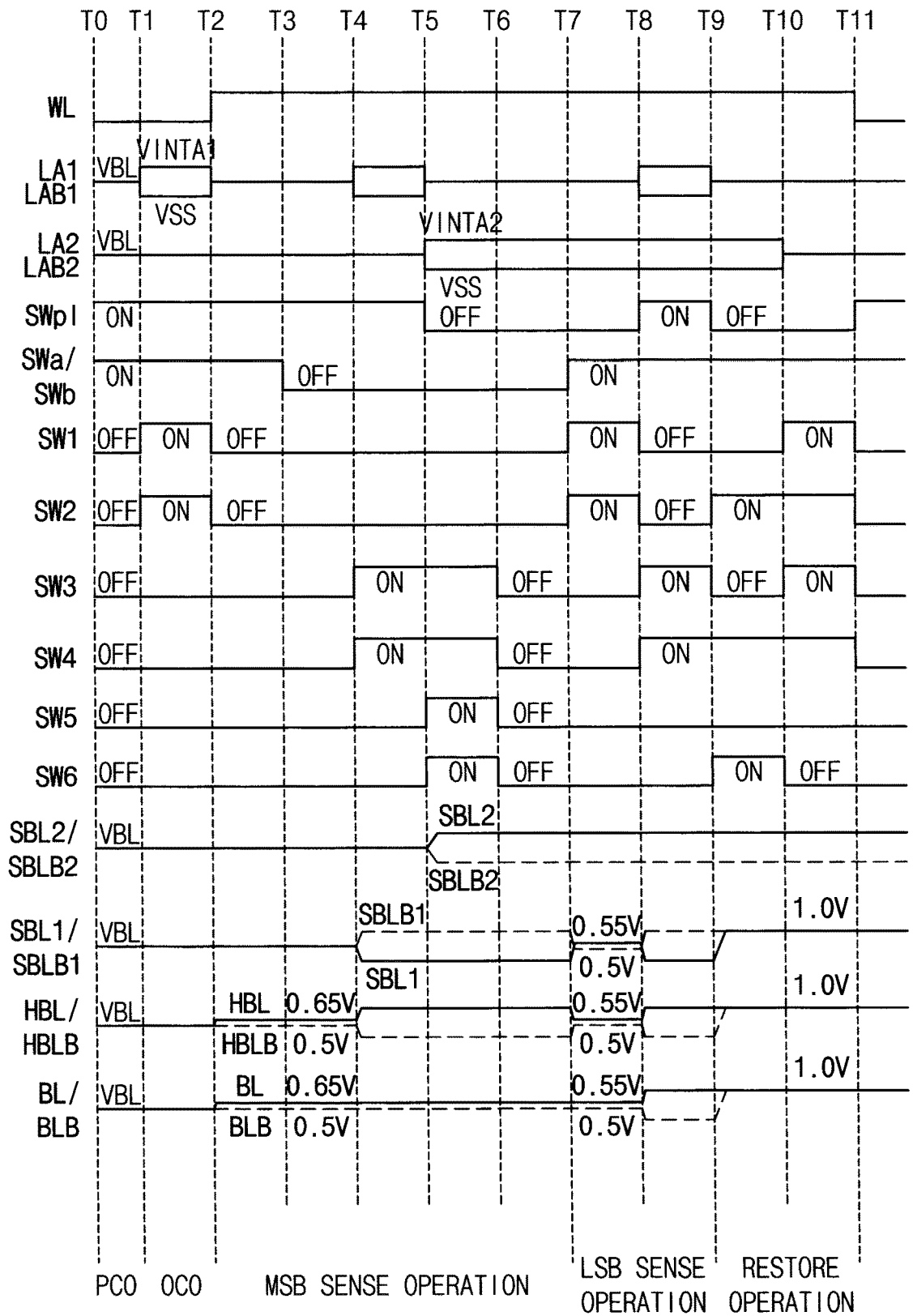

FIGS. 9 through 11 are timing diagrams for explaining operation of the sense amplifier to sense the multi-bit data stored in the memory cell, respectively.

FIG. 9 is a timing diagram illustrating an operation of the sense amplifier for sensing the cell voltage Vcell of 0 V stored in the memory cell MC, that is, the 2-bit data "00".

FIG. 9 differs from FIG. 8 in that the cell voltage Vcell is 0 V and voltages levels of the bit-line pair BL and BLB, voltage levels of the holding bit-line pair HBL and HBLB and the voltage levels of the first sensing bit-line pair SBL1 and SBLB1 are changed according to the cell voltage Vcell of 0 V.

FIG. 10 is a timing diagram illustrating an operation of the sense amplifier for sensing the cell voltage Vcell of 0.67 V stored in the memory cell MC, that is, the 2-bit data "10".

FIG. 10 differs from FIG. 8 in that the cell voltage Vcell is 0.67 V and voltages levels of the bit-line pair BL and BLB, voltage levels of the holding bit-line pair HBL and HBLB and the voltage levels of the first sensing bit-line pair SBL1 and SBLB1 are changed according to the cell voltage Vcell of 0.67 V.

FIG. 11 is a timing diagram illustrating an operation of the sense amplifier for sensing the cell voltage Vcell of 1.0 V stored in the memory cell MC, that is, the 2-bit data "11".

FIG. 11 differs from FIG. 8 in that the cell voltage Vcell is 1.0 V and voltages levels of the bit-line pair BL and BLB, voltage levels of the holding bit-line pair HBL and HBLB and the voltage levels of the first sensing bit-line pair SBL1 and SBLB1 are changed according to the cell voltage Vcell of 1.0 V.

Figure 12:
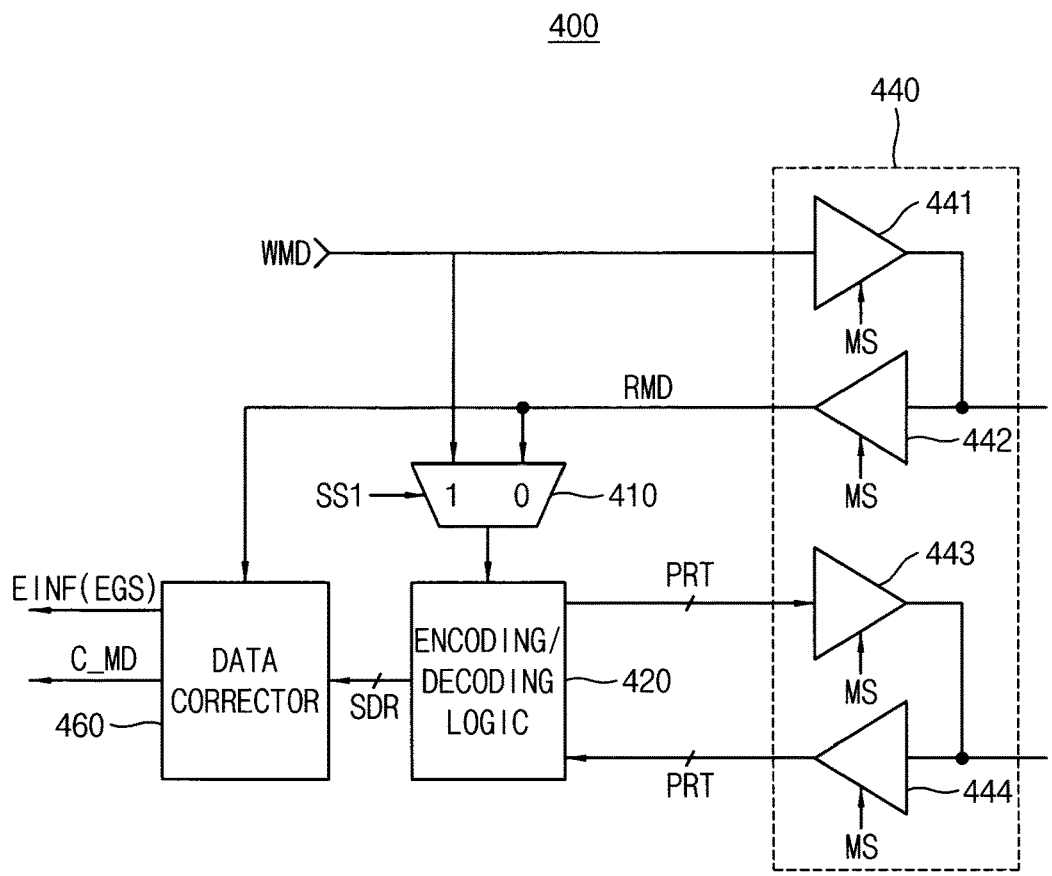
FIG. 12 illustrates an example of the ECC engine in FIG. 2 according to example embodiments.

FIG. 12 illustrates an example of the ECC engine in FIG. 2 according to example embodiments.

Referring to FIG. 12, the ECC engine 400 may include a multiplexer 410, an encoding/decoding logic 420, a buffer unit 440 and a data corrector 460. The buffer unit 440 may include first through fourth buffers 441-444.

The multiplexer 410, in a write operation, provides the encoding/decoding logic 420 with a write data WMD in response to a first selection signal SS1. The multiplexer 431, in a read operation, provides the encoding/decoding logic 420 with read data RMD from the buffer 442 in response to the first selection signal SS1. The buffers 441 and 443 may be enabled in the write operation in response to a mode signal MS and provide the write data WMD and the parity bits PRT to the I/O gating circuit 290. The buffers 442 and 444 may be enabled in the read operation in response to the mode signal MS, the buffer 442 may provide the read data RMD to the multiplexer 410 and the data corrector 460 and the buffer may provide the parity bits PRT to the encoding/decoding logic 420.

The encoding/decoding logic 420, in the write operation, may perform an ECC encoding on the write data WMD to provide the parity bits PRT to the buffer 443. The encoding/decoding logic 420, in the read operation, may perform an ECC decoding on the read data RMD from the multiplexer 410 based on the parity bits PRT from the buffer 444 to provide syndrome data SDR to the data corrector 460. The data corrector 460 corrects an error in the read data RMD based on the syndrome data SDR from the encoding/decoding logic 420 to provide corrected main data C_MD and may provide the control logic circuit 210 with the error information EINF including the error generation signal EGS if the error is detected in the read data RMD. The first selection signal SS1 and the mode signal MS may be included in the second control signal CTL12.

Figure 13:
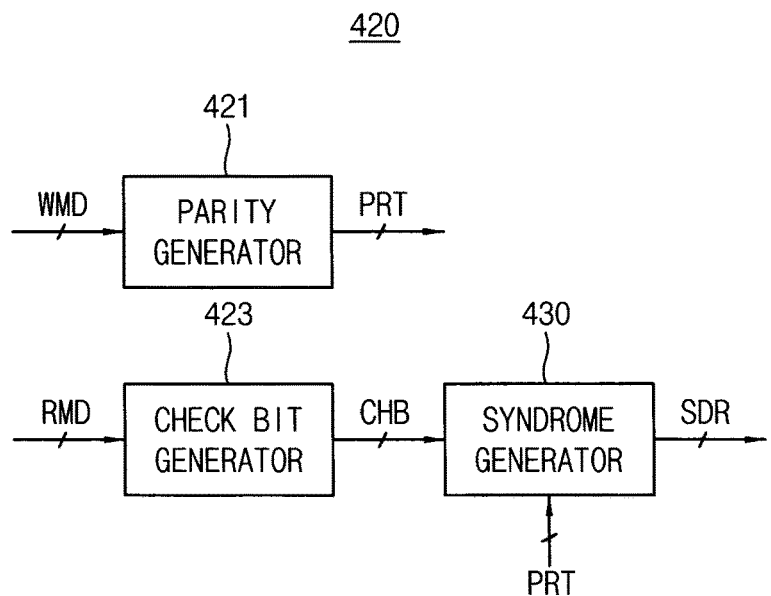
FIG. 13 illustrates the encoding/decoding logic in the ECC engine in FIG. 12 according to example embodiments.

FIG. 13 illustrates the encoding/decoding logic in the ECC engine in FIG. 12 according to example embodiments.

Referring to FIG. 13, the encoding/decoding logic 420 may include a parity generator 421, a check bit generator 423, and a syndrome generator 430.

The parity generator 421 may generate the parity bits PRT based on the write data WMD using an array of exclusive OR gates.

The check bit generator 423 may generate check bits CHB based on the read main data RMD. The syndrome generator 430 may generate the syndrome data SDR based on the check bits CHB based on the read data RMD and the parity bits PRT from the buffer 444.

Figure 14:
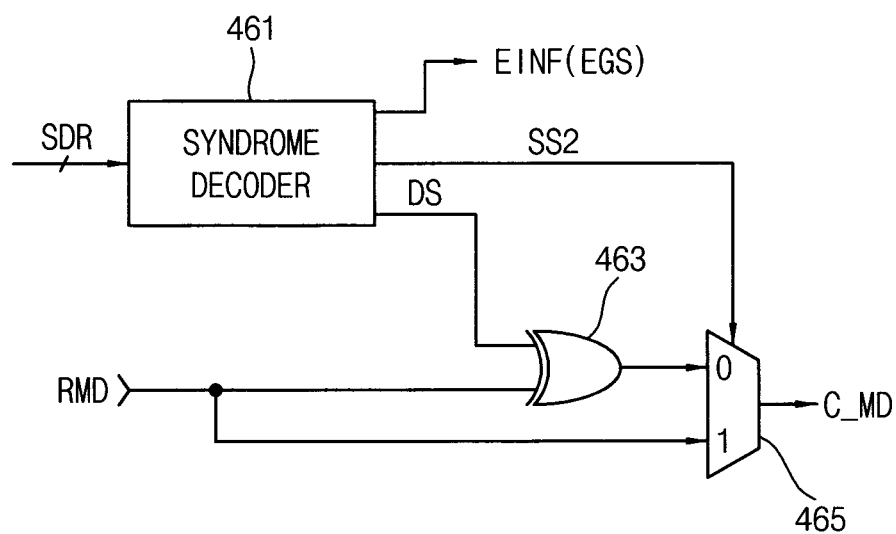
FIG. 14 illustrates the data corrector in the ECC engine in FIG. 12 according to example embodiments.

FIG. 14 illustrates the data corrector in the ECC engine in FIG. 12 according to example embodiments.

Referring to FIG. 14, the data corrector 460 may include a syndrome decoder 461, a bit inverter 463 and a selection circuit 465 which is implemented by a multiplexer.

The syndrome decoder 461 may decode the syndrome data SDR to generate a decoding signal DS and a second selection signal SS2 and the error information EINF including the error generation signal EGS. The decoding signal DS may indicate a position of the at least one error and the second selection signal SS2 may have a logic level depending on a number of the at least one error bit. The bit inverter 463 may invert the at least one error bit in response to the decoding signal DS. The selection circuit 465 may select one of the read data RMD and an output of the bit inverter 463 to provide the corrected main data C_MD in response to the second selection signal SS2.

Figure 15:
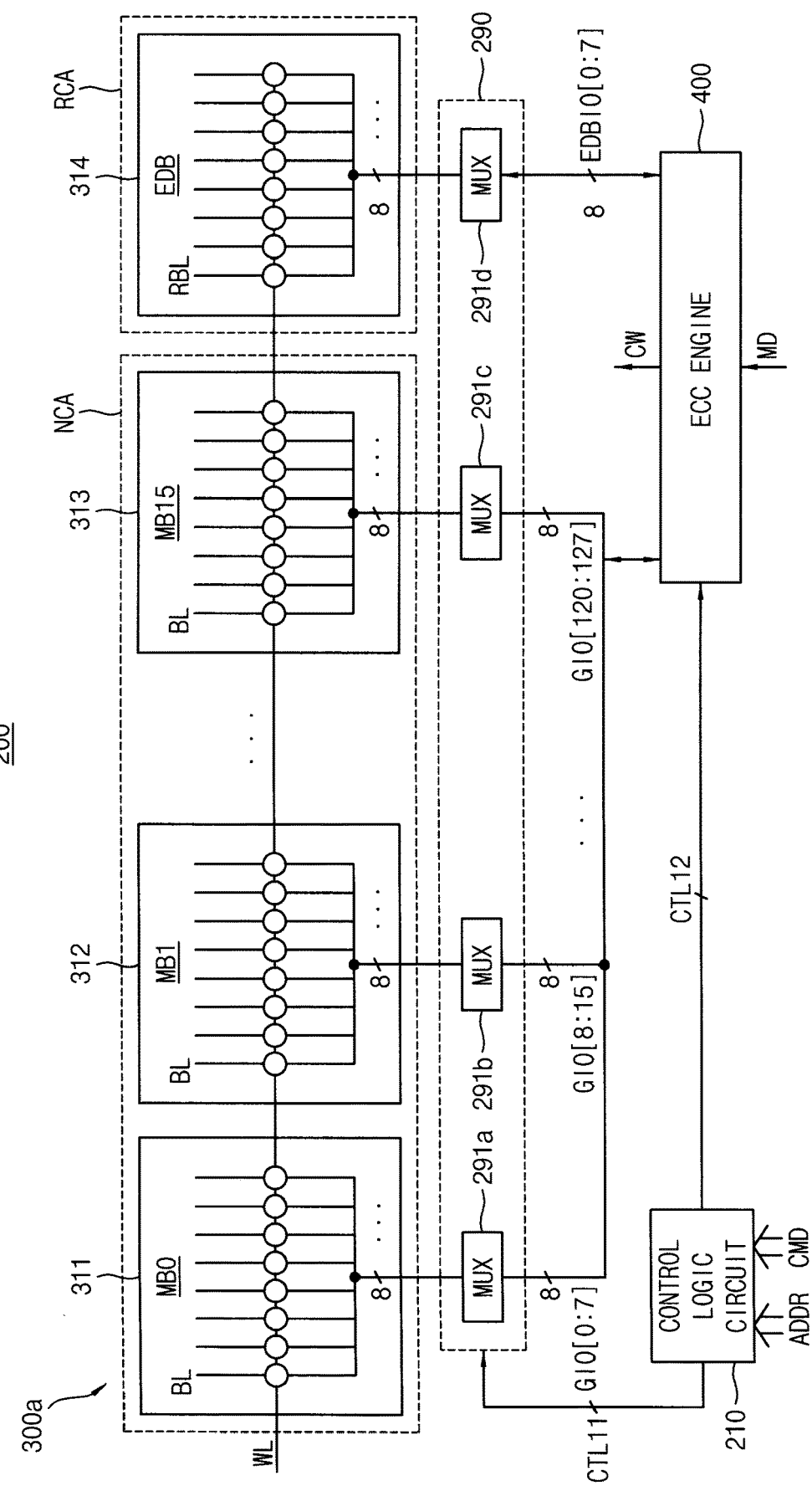
FIG. 15 illustrates a portion of the semiconductor memory device of FIG. 2 in a write operation.

FIG. 15 illustrates a portion of the semiconductor memory device of FIG. 2 in a write operation.

In FIG. 15, the control logic circuit 210, a memory cell array 300a, the I/O gating circuit 290, and the ECC engine 400 in the semiconductor memory device 200 are illustrated.

Referring to FIG. 15, the memory cell array 300a includes a normal cell array NCA and a redundancy cell array RCA. The normal cell array NCA includes a plurality of first memory blocks MB0-MB15, i.e., 311-313, and the redundancy cell array RCA includes at least a second memory block 314. The first memory blocks 311-313 are memory blocks determining a memory capacity of the semiconductor memory device 200. The second memory block 314 is for ECC and/or redundancy repair. Since the second memory block 314 for ECC and/or redundancy repair is used for ECC, data line repair and block repair to repair 'fail' cells generated in the first memory blocks 311-313, the second memory block 314 is also referred to as an EDB block. In each of the first memory blocks 311-313, a plurality of first memory cells are arranged in rows and columns. In the second memory block 314, a plurality of second memory cells are arranged in rows and columns. The first memory cells connected to intersections of the word-lines WL and the bit-lines BL may be dynamic memory cells. The second memory cells connected to intersections of the word-lines WL and bit-lines RBL may be dynamic memory cells.

The I/O gating circuit 290 includes a plurality of switching circuits 291a-291d respectively connected to the first memory blocks 311-313 and the second memory block 314.

The ECC engine 400 may be connected to the switching circuits 291a-291d through first data lines GIO [0:127] and second data lines EDBIO [0:7].

When the command CMD is a write command, the control logic circuit 210 provides the second control signal CTL12 to the ECC engine 400 and the ECC engine 400 performs the ECC encoding on the main data MD to generate parity bits associated with the main data MD and provides the I/O gating circuit 290 with the codeword CW including the main data MD and the parity bits. The control logic circuit 210 provides the first control signal CTL11 to the I/O gating circuit 290 such that the codeword CW is to be stored in a sub-page of the target page in the memory cell array 300a.

Figure 16:
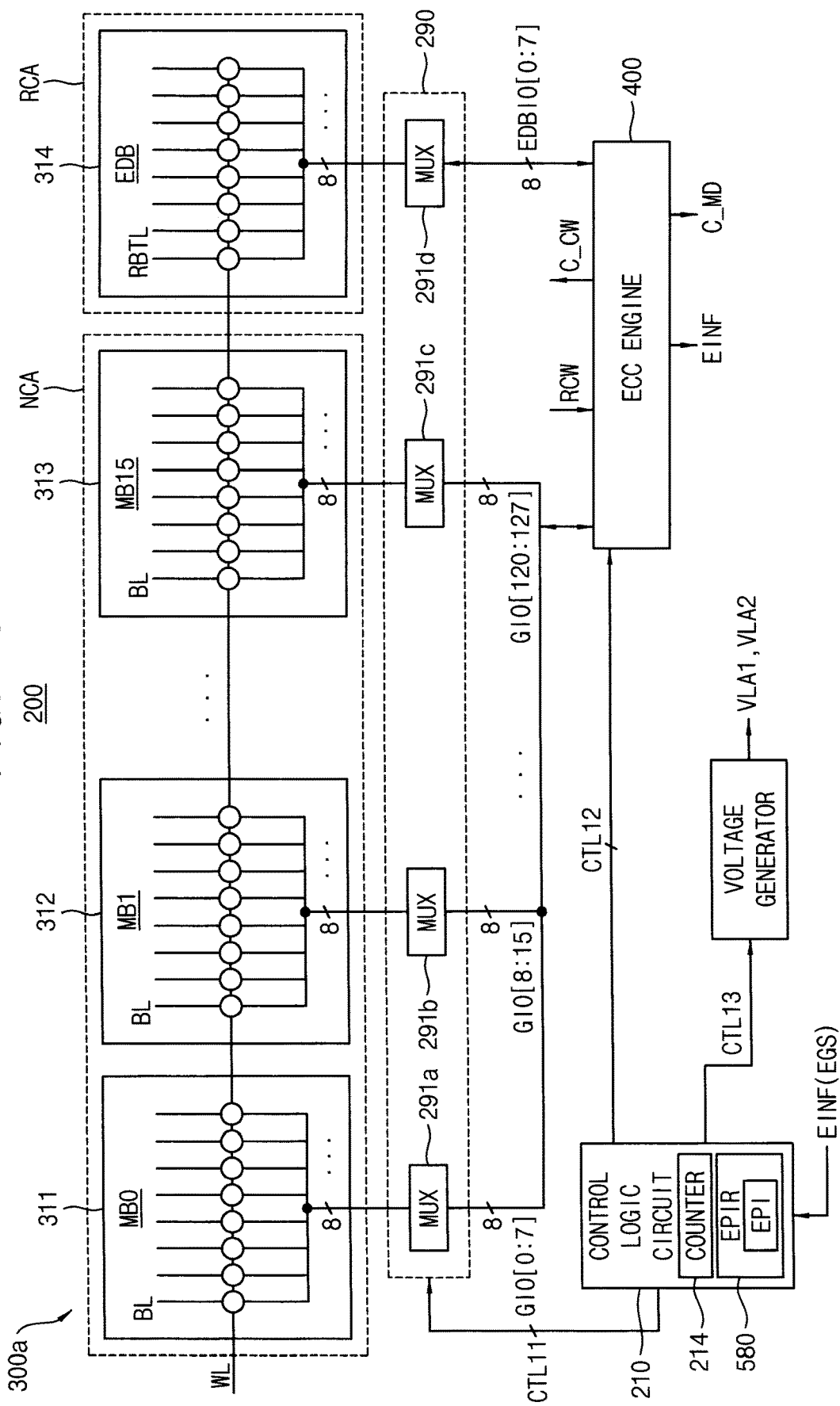
FIG. 16 illustrates the semiconductor memory device of FIG. 2 in a read operation.

FIG. 16 illustrates the semiconductor memory device of FIG. 2 in a read operation.

In FIG. 16, the control logic circuit 210, the memory cell array 300a, the I/O gating circuit 290, the ECC engine 400, and the voltage generator 700 are illustrated. In addition, the control logic circuit 210 includes a counter 214 and the EPIR 580.

Referring to FIG. 16, when the command CMD is a read command to designate a read operation, the control logic circuit 210 provides the first control signal CTL11 to the I/O gating circuit 290 such that codeword RCW stored in the sub-page of the target page in the memory cell array 300a is provided to the ECC engine 400.

In the read operation, the ECC engine 400 performs a scrubbing operation by performing an ECC decoding on the codeword RCW, correcting at least one error in the codeword RCW and writing back the corrected data in a memory location in which a sub-page is stored. When the least one error is detected during performing the scrubbing operation, the ECC engine 400 provides the control logic circuit 210 with the error information EINF including the error generation signal EGS whenever the error is detected, the counter 214 in the control logic circuit 210 counts the error generation signal EGS and the control logic circuit 210 records the error pattern information indicating error occurrence tendency associated with each of some pages in the EPIR 580 by accumulating the error information EINF. The error information EINF may at least include a number of error occurrences of selected memory cell rows based on counting the error generation signal EGS. In a refresh operation, the ECC engine 400 performs the scrubbing operation and provides the error information EINF to the control logic circuit 210.

The control logic circuit 210 may control the voltage generator 700 to adjust voltages levels of the driving voltages VLA1 and VLA2 using the third control signal CTL13, based on the error pattern information.

Figures 17, 18:
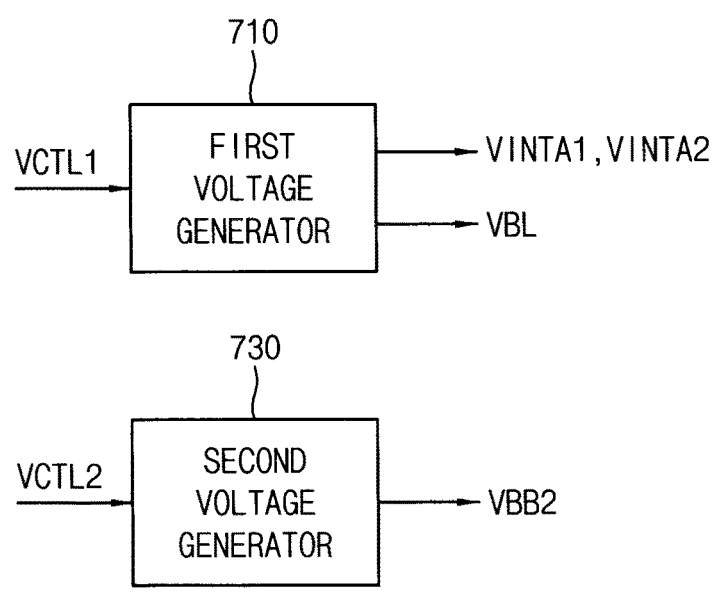
FIG. 17 illustrates the error pattern information register in the semiconductor memory device of FIG. 2 according to example embodiments.
FIG. 18 is an example of the voltage generator in the semiconductor memory device of FIG. 2 according to example embodiments.

FIG. 17 illustrates the error pattern information register in the semiconductor memory device of FIG. 2 according to example embodiments.

Referring to FIG. 17, each of indexes (e.g., entries) Idx1, Idx2, . . . , Idxu (u is a natural number greater than two) may include page error information on each of some pages of memory cell array 300. Each entry may correspond to one of the pages. The error information register 580 includes a plurality of columns 581, 582, 583, 584, 585, and 586.

The first column 581 stores ranking information RNK on ranking of a number of error occurrences based on the number of the error occurrences of each of the some pages. An entry with ranking information RNK having a lowest value (e.g., 1) could be considered a highest rank and an entry with ranking information RNK having a highest value could be considered a lowest rank. For example, a first page associated with idx1 having 2 error occurrences during a given period could receive a RNK of 2 while a second page associated with Idx2 could receive a higher RNK of 1 when it has 4 error occurrences during the given period.

The second column 582 stores address information ADDINF of each of the some pages. In an exemplary embodiment, the address information ADDINF includes at least one of a bank group address ('BGA'), a bank address ('BA'), and a row address ('RA'). While FIG. 3 illustrated a single group of bank arrays (e.g., 310-340), additional groups of bank arrays may be present. The bank group address may identify one of these groups. For example, if there is a first group of bank arrays includes bank arrays 310-380 and a second group of bank arrays, and the errors are occurring in the first group, the BGA would identify the first group. The bank address may identify one of the banks of the identified group. The row address may identify a page of the one bank.

The third column 583 stores a number of error occurrences ECNT of each of the some pages. For example, the error log register 580 of FIG. 14 illustrates the number of error occurrences ECNT for a page having address A is 2 and the number of error occurrences ECNT for a page having address B is 4. The fourth column 584 stores a number of sub-pages FCWCNT including a bit error, of each of the some pages. For example, if a second page has 4 bit errors (ECNT=4), the second page has 64 sub-pages, but only 3 of the 64 sub-pages have bit errors (e.g., sub-pages 1 and 12 each have 1 bit error and sub-page 43 has 2 bit errors), the entry of the second page would have a FCWCNT of 3.

The fifth column 585 stores the flag information FG The flag information FG indicates whether the error information of the corresponding page is initially written into the error log register 580. When the error information of the corresponding page is initially written into the error log register 580, the flag information FG has a first logic level (e.g., 0).

In an embodiment, if the flag information FG of a page has a second logic level (e.g., 1), the page previously had error information.

FIG. 18 is an example of the voltage generator in the semiconductor memory device of FIG. 2 according to example embodiments.

Referring to FIG. 18, the voltage generator 700 may include a first voltage generator 710 and the second voltage generator 730. The first voltage generator 710 may generate the first power supply voltage VINTA1, the second power supply voltage VINTA2 and the pre-charge voltage VBL and may adjust a voltage level of each of the first power supply voltage VINTA1, the second power supply voltage VINTA2 and the pre-charge voltage VBL based on a first voltage control signal VCTL1. The second voltage generator 720 may generate a negative voltage VBB2 and may adjust a voltage level of the negative voltage VBB2 based on a second voltage control signal VCTL2. With respect to the VINTA1 and VINTA2, VBB2 may be referred to in some embodiments as a third voltage or a negative voltage. The first voltage control signal VCTL1 and the second voltage control signal VCTL2 may be included in the third control signal CTL13.

Figure 19:
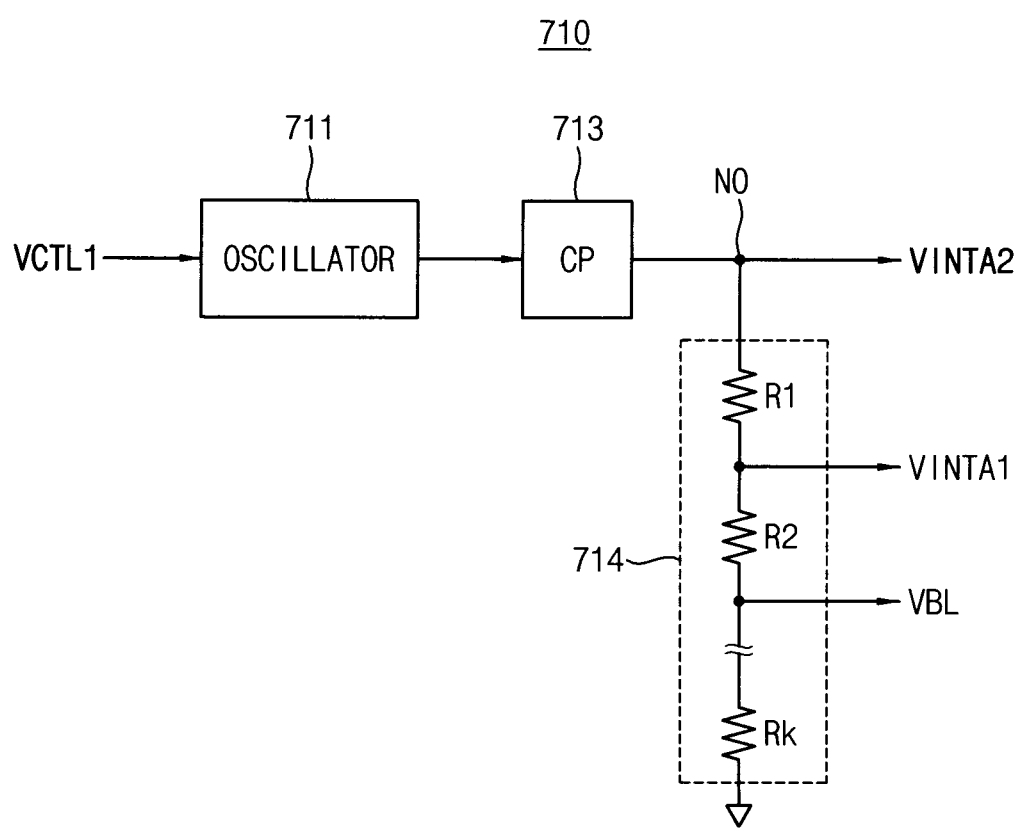
FIG. 19 illustrates the first voltage generator in FIG. 18 according to example embodiments.

FIG. 19 illustrates the first voltage generator in FIG. 18 according to example embodiments.

Referring to FIG. 19, the first voltage generator 710 includes an oscillator 711, a charge pump 713 and a voltage divider 714. The oscillator 711 operates in response to the first voltage control signal VCTL1 and generates pulse signals, The charge pump 713 performs pumping operation in response to the pulse signals to generate the second power supply voltage VINTA2. The voltage divider 714 includes a plurality of resistors R1-Rk connected in series between an output node NO and a ground voltage, voltage-divides the second power supply voltage VINTA2 and generates the first power supply voltage VINTA1 and the pre-charge voltage VBL. Although one charge pump 713 is illustrated in FIG. 19, the first voltage generator 710 may include a plurality of charge pumps and may adjust a voltage level of each of the first power supply voltage VINTA1, the second power supply voltage VINTA2 and the pre-charge voltage VBL, respectively.

Configuration of the second voltage generator 730 in FIG. 18 may be similar with the configuration of the first voltage generator 710 of FIG. 19.

FIG. 20 illustrates tendency of error pattern based on change of the cell voltage in the semiconductor memory device of FIG. 2.

In FIG. 20, a reference numeral 751 denotes a tendency of error pattern based on change of the cell voltage Vcell in the memory cells coupled to the bit-line which is coupled to the sense amplifier 280 and whose length is relatively long from the sense amplifier 280 and a reference numeral 753 denotes a tendency of error pattern based on change of the cell voltage Vcell in the memory cells coupled to the bit-line which is coupled to the sense amplifier 280 and whose length is relatively short from the sense amplifier 280. Referring to FIG. 20, errors occur frequently in some particular ranges in the cell voltage Vcell.

A reference numeral 761 denotes that the sense amplifier 280 performs sensing operation, and a reference numeral 773 denotes that the sense amplifier 280 performs restore operation. A reference numeral 762 denotes that the voltage generator 700 increases the voltage level of the pre-charge voltage VBL, a reference numeral 763 denotes that the voltage generator 700 decreases the voltage level of the pre-charge voltage VBL, reference numerals 764 and 765 denote that the voltage generator 700 increases/decreases the voltage level of the first power supply voltage VINTA1, respectively, and reference numerals 766 and 767 denote that the voltage generator 700 increases/decreases the voltage level of the first power supply voltage VINTA1 respectively.

In addition, a reference numeral 781 denotes that the voltage generator 700 increases a voltage difference between the second power supply voltage VINTA2 and the negative voltage VBB2, a reference numeral 782 denotes that the voltage generator 700 decreases the voltage level of the first power supply voltage VINTA1 and a reference numeral 783 denotes that the voltage generator 700 decreases the voltage level of the first power supply voltage VINTA1. In addition, a reference numeral 791 denotes that an error does not occur in the multi-bit data at a corresponding cell voltage Vcell, a reference numeral 792 denotes that an error occurs in the multi-bit data at a corresponding cell voltage Vcell and a reference numeral 792 denotes a level of a voltage that is restored in the memory cell MC. Reference numeral 793 indicates a re-stored value of Vcell (corresponding to item S150 in FIG. 6).

FIGS. 21A through 21F, respectively, illustrate that the control logic circuit controls the voltage generator to adjust a voltage level of driving voltages based on the error pattern information.

In FIGS. 21A through 21F, a rectangular indicates that an error is associated with a corresponding bit.

Referring to FIGS. 21A through 21F, the control logic circuit 210 controls the voltage generator 700 to adjust voltage levels of at least one of a first driving voltage set, a second driving voltage set and the pre-charge voltage VBL based on the error pattern information EPI stored in the EPIR 580. The first driving voltage set may include the first power supply voltage VINTA1 and the ground voltage VSS which are provided to the sense amplifying circuit 281, and the second driving voltage set may include the second power supply voltage VINTA2 and the negative voltage VBB2 which are provided to the latch circuit 283.

Referring to FIGS. 21A and 21B, if the error pattern information EPI indicates that an error is associated with the second bit in each of the data read from the target page, the control logic circuit 210 may control the voltage generator 700 to adjust a voltage level of the first power supply voltage VINTA1. If each of the data read from the target page includes the first bit and the second bit having different logic levels and if the error pattern information EPI indicates that the error is associated with the second bit, the control logic circuit 210 may control the voltage generator 700 to increase the voltage level of the first power supply voltage VINTA1. If each of the data read from the target page includes the first bit and the second bit having a same logic level and if the error pattern information EPI indicates that the error is associated with the second bit, the control logic circuit 210 may control the voltage generator 700 to decrease the voltage level of the first power supply voltage VINTA1.

In the error patterns of FIGS. 21A through 21F, examples are given in terms of multi-bit data which is two bits: a first bit at a leftmost bit position and a second bit at a rightmost bit position. For example, in FIG. 21A, an error tendency is associated with the second bit position for multi-bit values 10 and 01. For the multi-bit value 10, the leftmost bit is a 1. For the multi-bit value 01, the leftmost bit is a 0. The first bit or first bit position may be referred to as "one first bit" to indicate the leftmost bit position generically for many memory cells. Similarly, the second bit or second bit position may be referred to as "one second bit" to indicate the rightmost bit position generically for many memory cells.

Referring to FIGS. 21C and 21D, if the error pattern information EPI indicates that an error is associated with a bit having a same logic level, of the first bit and the second bit in each of the data read from the target page, the control logic circuit 210 may control the voltage generator 700 to adjust a voltage level of the pre-charge voltage VBL. If the error pattern information EPI indicates that the error is associated with a bit having a logic high level, of the first bit and the second bit, the control logic circuit 210 may control the voltage generator 700 to decrease the voltage level of the pre-charge voltage VBL. If the error pattern information EPI indicates that the error is associated with a bit having a logic low level, of the first bit and the second bit, the control logic circuit 210 may control the voltage generator 700 to increase the voltage level of the pre-charge voltage VBL.

Referring to FIGS. 21E and 21F, if the error pattern information EPI indicates that an error is associated with all combinations of the first bit and the second bit in each of the data read from the target page, the control logic circuit 210 may control the voltage generator 700 to adjust voltage levels of the second power supply voltage VINTA2 and the negative voltage VBB2. If the first bit and the second bit of the data have a same logic level and if the error pattern information EPI indicates that the error is associated with the second bit and if the first bit and the second bit of the data have different logic levels and if the error pattern information EPI indicates that the error is associated with the first bit, the control logic circuit 210 may control the voltage generator 700 to increase the voltage levels of the second power supply voltage VINTA2 and the negative voltage VBB2. If the first bit and the second bit of the data have a same logic level and if the error pattern information EPI indicates that the error is associated with the first bit and if the first bit and the second bit of the data have different logic levels and if the error pattern information EPI indicates that the error is associated with the second bit, the control logic circuit 210 may control the voltage generator 700 to decrease the voltage levels of the second power supply voltage VINTA2 and the negative voltage VBB2.

Thus, by adjusting the first driving voltage set of the sense amplifying circuit 281, the second driving voltage set of the latch circuit 283, and the pre-charge values indicated in FIG. 3, the operation margin of the semiconductor memory device is increased. Increase of the operating margin means that the semiconductor memory device can store data in a higher density (multi-bit per memory cell) with improved reliability. Improved reliability means that an error rate is reduced for data read from the memory device for use by another device.

The improvement is obtained by recognizing relationships between error patterns (see FIGS. 21A through 21F below), adjusting driving voltages, and sensing and restoring data (see, for example, FIGS. 7A through 7K, 8 and 20).

Figure 22:
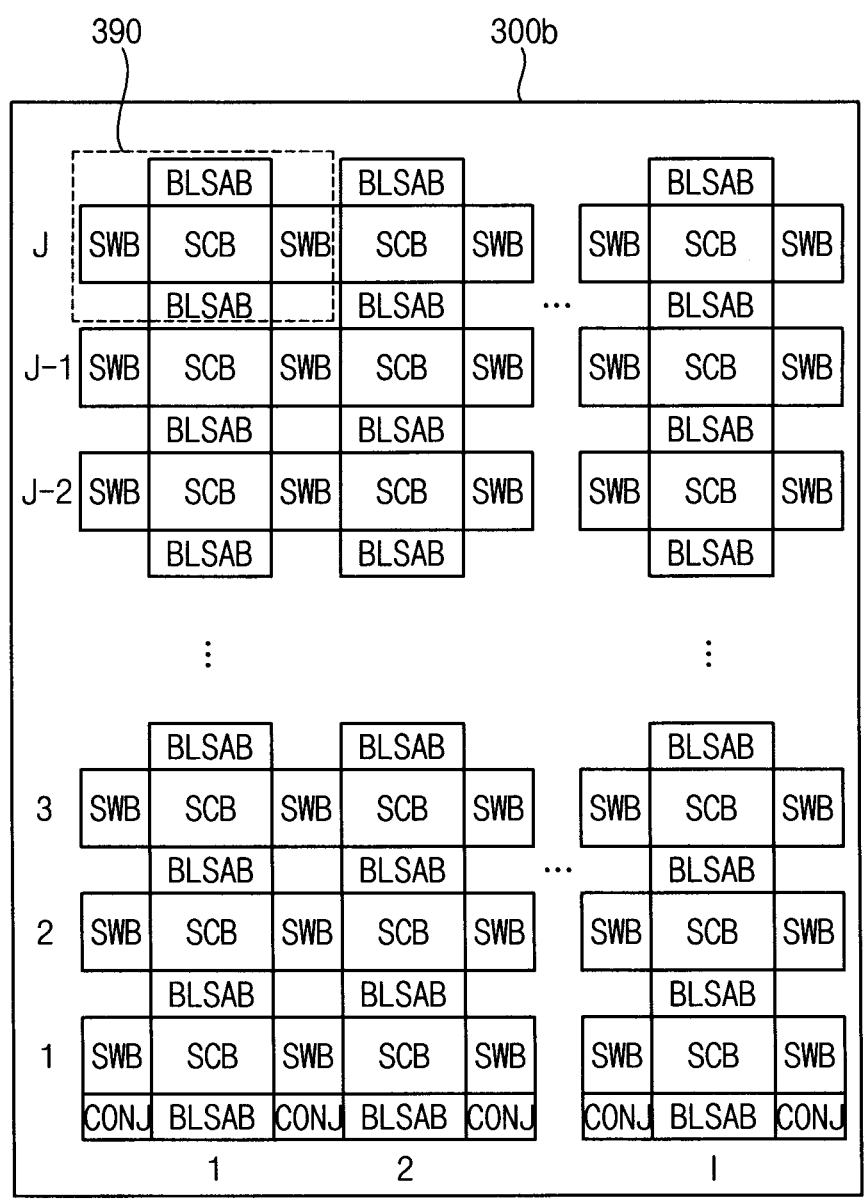
FIG. 22 illustrates an example of the memory cell array in the semiconductor memory device of FIG. 2 according to example embodiments.

FIG. 22 illustrates an example of the memory cell array in the semiconductor memory device of FIG. 2 according to example embodiments.

Referring to FIG. 22, in a memory cell array 300b, I sub-array blocks SCB may be disposed in a second direction D2, and J sub-array blocks SCB may be disposed in a first direction D1 substantially perpendicular to the second direction D2. A plurality of bit-lines, a plurality of word-lines, and a plurality of memory cells may be disposed in each of the sub-array blocks SCB.

I+1 sub word-line driver regions SWB may be disposed between the sub-array blocks SCB in the second direction D2. Sub word-line drivers may be disposed in the sub word-line driver regions SWB. J+1 bit-line sense amplifier regions BLSAB may be disposed, for example between the sub-array blocks SCB in the first direction D1. Bit-line sense amplifiers to sense data stored in the memory cells may be disposed in the bit-line sense amplifier regions BLSAB.

A plurality of conjunction regions CONJ may be disposed adjacent the sub word-line driver regions SWB and the bit-line sense amplifier regions BLSAB. A voltage generator is disposed in each of the conjunction regions CONJ.

A portion 390 of the memory cell array 300b will be described in FIG. 23.

Figure 23:
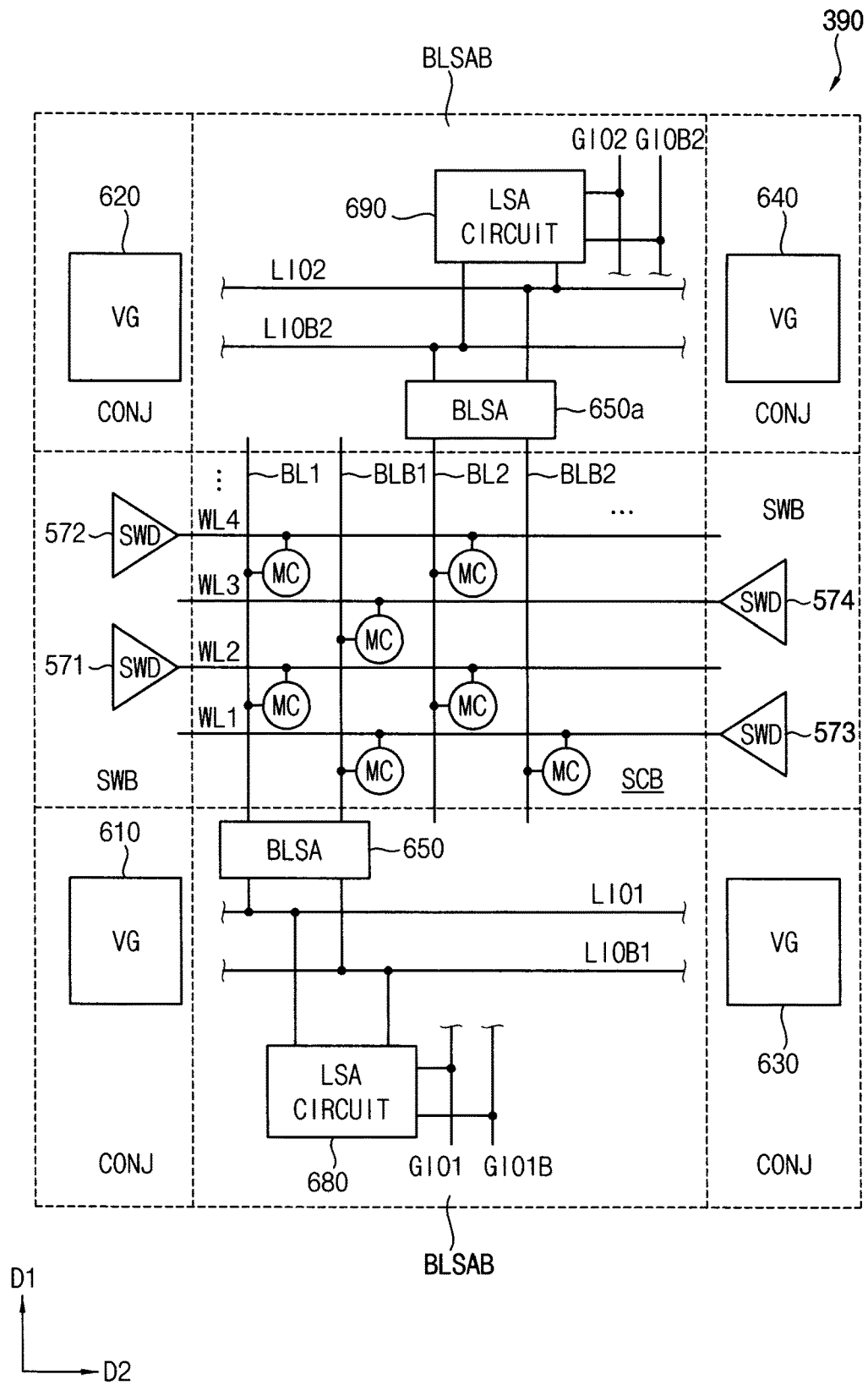
FIG. 23 illustrates a portion of the memory cell array in FIG. 22 according to example embodiments.

FIG. 23 illustrates a portion of the memory cell array in FIG. 22 according to example embodiments.

Referring to FIGS. 22 and 23, in the portion 390 (FIG. 22) of the memory cell array 300b, the sub-array block SCB, the bit-line sense amplifier regions BLSAB, the sub word-line driver regions SWB and the conjunction regions CONJ are disposed. Voltage generators 610, 620, 630 and 640 may be disposed in the conjunction regions CONJ, respectively. The sub-array block SCB includes a plurality of word-lines WL1-WL4 extending in a row direction (the second direction D2) and a plurality of bit-line pairs BL1-BL2 and BLB1-BLB2 extending in a column direction (the first direction D1). The sub-array block SCB includes a plurality of memory cells MCs disposed at intersections between the word-lines WL1-WL4 and the bit-line pairs BL1-BL2 and BLB1-BLB2.

With continued reference to FIG. 23, the sub word-line driver regions SWB include a plurality of sub word-line drivers 571, 572, 573 and 574 that respectively drive the word-lines WL1-WL4. The sub word-line drivers 571 and 572 may be disposed in the sub word-line driver region SWB, which is leftward (in this example), with respect to the sub-array block SCB. In addition, the sub word-line drivers 573 and 574 may be disposed in the sub word-line driver region SWB, which is rightward (in this example), with respect to the sub-array block SCB.

The bit-line sense amplifier regions BLSAB include bit-line sense amplifiers BLSA 650 and 650a coupled to the bit-line pairs BL1-BL2 and BLB1-BLB2, and local sense amplifier circuits 680 and 690. The bit-line sense amplifier 650 may sense and amplify a voltage difference between the bit-line pair BL and BLB to provide the amplified voltage difference to a local I/O line pair LIO1 and LIOB1.

The local sense amplifier circuit 680 controls connection between the local I/O line pair LIO1 and LIOB1 and a global I/O line pair GIO1 and GIOB1, and the local sense amplifier circuit 690 controls connection between the local I/O line pair LIO2 and LIOB2 and a global I/O line pair GIO2 and GIOB2.

Each of the bit-line sense amplifiers BLSA 650 and 650a may employ the sense amplifier 280 of FIG. 5 and each of the voltage generators 610, 620, 630 and 640 may employ the voltage generator 700 of FIG. 18.

Figure 24:
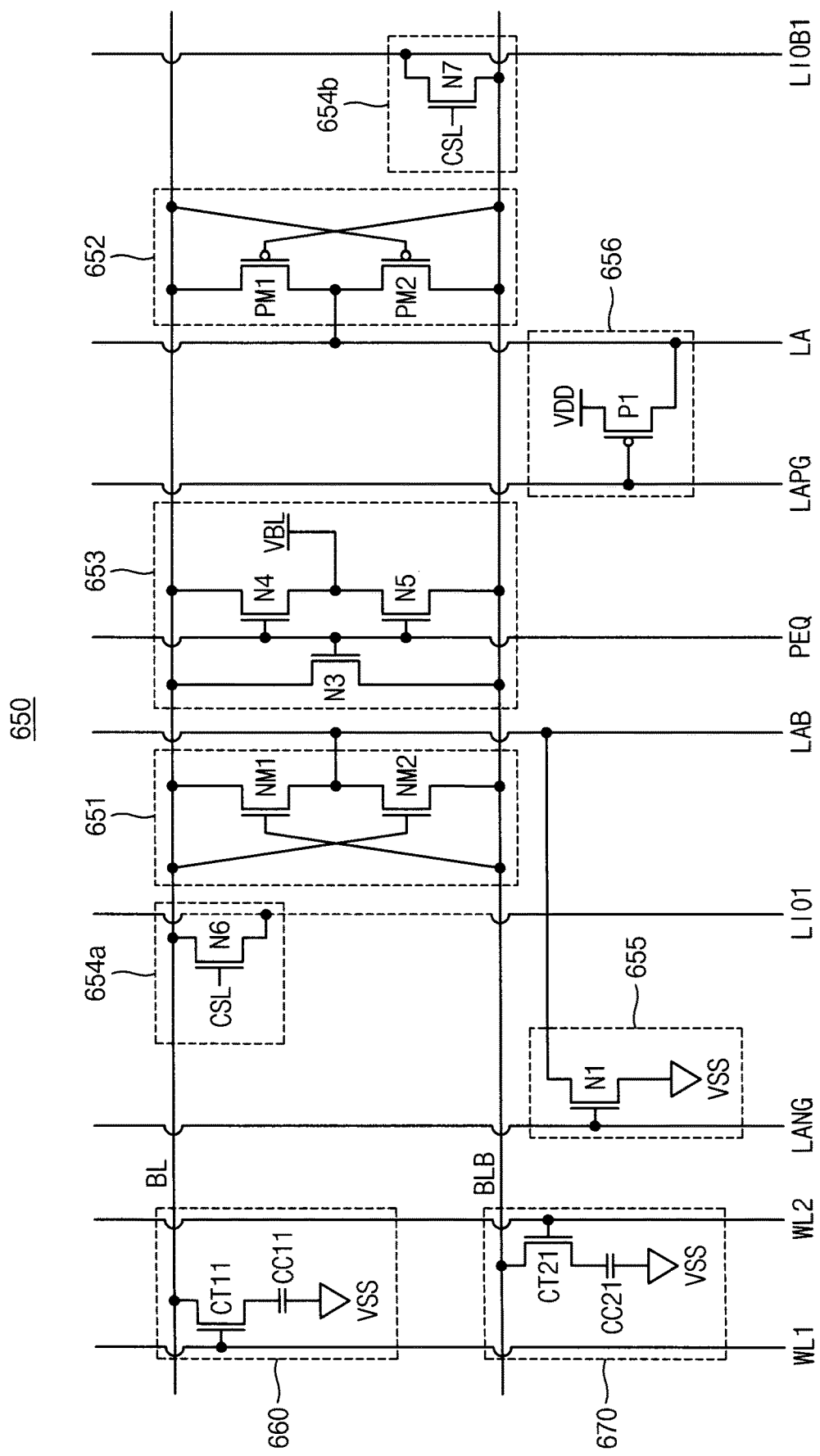
FIG. 24 is a circuit diagram illustrating an example of a bit-line sense amplifier that may be employed as one of the bit-line sense amplifiers in FIG. 23 according to example embodiments.

FIG. 24 is a circuit diagram illustrating an example of a bit-line sense amplifier that may be employed as one of the bit-line sense amplifiers in FIG. 23 according to example embodiments.

Referring to FIG. 24, bit-line sense amplifier 650b may be coupled to bit-lines BL1 and BLB1 of each of memory cells 660 and 670 in the memory cell array 300b. The memory cell 660 may correspond to the memory cell MC of sub-array block SCB that is at the intersection of bit-line BL1 and word-line WL1, and the memory cell 670 may correspond to the memory cell MC of sub-array block SCB that is located at the intersection of bit-line BLB1 and-word line WL2. The bit-line sense amplifier 650b includes an N-type sense amplifier 651, a P-type sense amplifier 652, a pre-charge circuit 653, column select switches 654a and 654b, an N-type sense amplifier (NSA) driver 655, and a P-type sense amplifier (PSA) driver 656.

The N-type sense amplifier 651 discharges a low-level bit-line of the bit-lines (or, bit-line pair) BL1 and BLB1 to a low level during a sensing operation. The N-type sense amplifier 651 includes two n-channel metal oxide semiconductor (NMOS) transistors NM1 and NM2. A gate of the NMOS transistor NM1 is connected to the bit-line (second bit-line) BLB1, and a drain of the NMOS transistor NM1 is connected to the bit-line (first bit-line) BL1, and a source of the NMOS transistor NM1 is connected to a sense enable line LAB. The NMOS transistor NM2 has a gate connected to the bit-line BL1, a drain connected to the sense enable line LAB, and a source connected to the bit-line BLB1. The N-type sense amplifier 651 connects a low-level bit-line to the sense enable line LAB. The sense enable line LAB is connected to the ground voltage VSS.

The N-type sense amplifier 651 discharges a low-level bit-line of the bit-lines BL1 and BLB1 with the ground voltage VSS provided at the sense enable line LAB.

The P-type sense amplifier 652 charges a high-voltage bit-line of the bit-lines BL1 and BLB1 with a power supply voltage VDD level at a sensing operation. The P-type sense amplifier 652 includes two p-channel metal oxide semiconductor (PMOS) transistors PM1 and PM2. The PMOS transistor PM1 has a gate connected to the bit-line BLB1, a source connected to the bit-line BL1, and a drain connected to a sense enable line LA. The PMOS transistor PM2 has a gate connected to the bit-line BL1, a source connected to sense enable line LA, and a drain connected to the bit-line BLB1.

The P-type sense amplifier 652 charges a high-voltage bit-line of the bit-lines BL1 and BLB1 with a power supply voltage VDD provided to the sense enable line LA.

The PSA driver 656 provides a charging voltage VDD to the sense enable line LA. Therefore, the transistor PM2 is turned off because the gate of the transistor PM2 is coupled to the bit-line BL1 with a voltage increased by the charge sharing.

The pre-charge circuit 653 pre-charges the bit-lines BL1 and BLB1 with a half voltage VDD/2 in response to a control signal PEQ in sensing operation. When the control signal PEQ is activated, the pre-charge circuit 653 supplies a bit-line pre-charge voltage VBL to the bit-lines BL1 and BLB1. The bit-line pre-charge voltage VBL may be a half voltage VDD/2. The bit-lines BL1 and BLB1 are connected such that their voltages are equalized. If the bit-lines BL1 and BLB1 are charged by the pre-charge level VBL, the control signal PEQ is inactivated. The pre-charge circuit 653 includes NMOS transistors N3, N4, and N5.

The column select switches 654a and 654b provide data sensed by the N-type and P-type sense amplifiers 651 and 652 to input/output lines LIO1 and LIOB1 in response to a column selection signal CSL. The column select switches 654a and 654b are turned on such that the sensed data is transferred to the input/output lines LIO1 and LIOB1. For example, in a read operation when sensing levels of the N-type and P-type sense amplifiers 651 and 652 are stabilized, a column selection signal CSL is activated. Then the column select switches 654a and 654b are turned on such that the sensed data is transferred to the local I/O line pair LIO1 and LIOB1. Voltages of the bit-lines BL1 and BLB1 are varied when charges of bit-lines BL1 and BLB1 are shared with the input/output lines LIO1 and LIOB1. The column select switches 654*a* and 654*b* includes NMOS transistors N6 and N7, respectively.

The NSA driver 655 provides a driving signal to the sense enable line LAB of the N-type sense amplifier 651. The NSA driver 655 receives the control signal LANG from the control logic circuit 210. Based on the control signal LANG the NSA driver 655 grounds the sense enable line LAB. The NSA driver 655 includes the ground transistor N1 to control a voltage of the sense enable line LAB. The PSA driver 656 provides the charge voltage VINTA to the sense enable line LA of the P-type sense amplifier 652. The PSA driver 656 is controlled by the control signal LAPG from the control logic circuit 210. The control signals LAPG and LANG are complementary to each other. The control logic circuit 210 may control the voltage generator 610 to adjust a voltage level of the charge voltage VINTA based on the error pattern information EPI.

Figure 25:
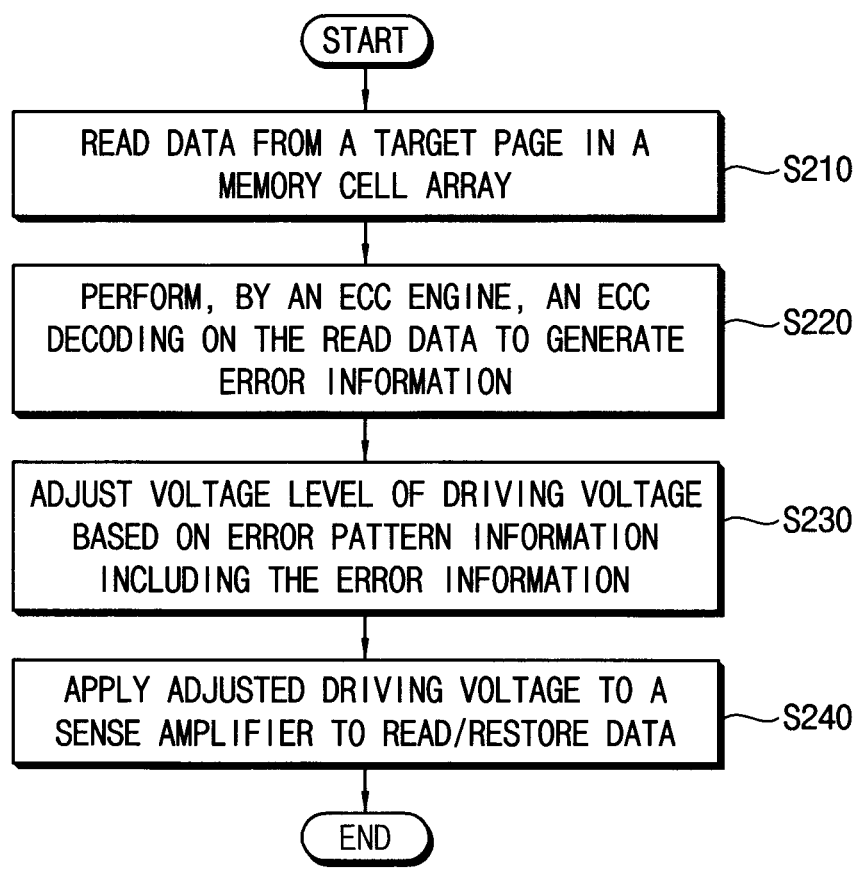
FIG. 25 is a flow chart illustrating a method of operating a semiconductor memory device according to example embodiments.

FIG. 25 is a flow chart illustrating a method of operating a semiconductor memory device according to example embodiments.

Referring to FIGS. 2 through 25, there is provided a method of operating a semiconductor memory device that includes a memory cell array 300 that includes a plurality of memory cells coupled to word-lines and bit-lines, and a plurality of sense amplifiers 280 to sense data stored in the plurality of memory cells. In the method, data (codeword) is read from a target page of the memory cell array 300 (S210). The ECC engine 400 generates error information by perform an ECC decoding on the read data (S220). The control logic circuit 210 controls at least one voltage generator 700 to adjust voltage levels of driving voltages based on error pattern information EPI including the error information (S230). The voltage generator 700 provides the driving voltages to the sense amplifiers 280. The voltage generator 700 applies the adjusted driving voltages to at least some of the sense amplifiers 280 to sense/restore data (S240).

According to example embodiments of the present disclosure, the control logic circuit generates error pattern information by accumulating error information obtained by a result of ECC decoding and the control logic circuit controls the voltage generator to adjust voltage levels of driving voltages provided to sense amplifiers based on the error pattern information such that operating margin of the sense amplifier may be increased. Therefore, the semiconductor memory device may enhance performance.

Figure 26:
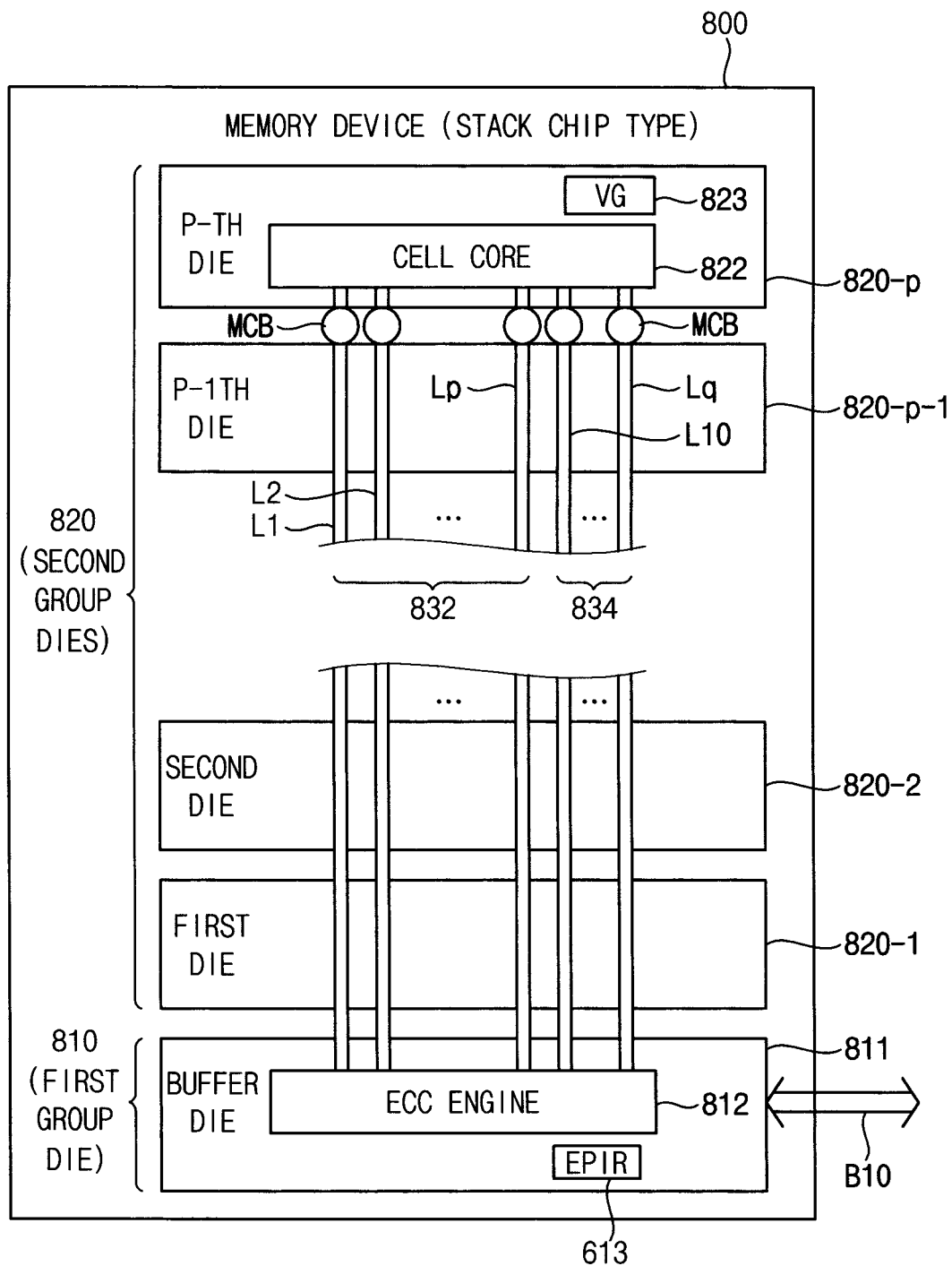
FIG. 26 is a block diagram illustrating a semiconductor memory device according to example embodiments.

FIG. 26 is a block diagram illustrating a semiconductor memory device according to example embodiments.

Referring to FIG. 26, a semiconductor memory device 800 may include a first group of dies 810 and a second group of dies 820.

The first group of dies 810 may include at least one buffer or logic die 811. The second group of dies 820 may include a plurality of memory dies 820-1 to 820-*p* which is stacked on the buffer die 811 and conveys data through a plurality of through substrate via lines, for example, through silicon via (TSV) lines. At least one of the memory dies 820-1 to 820-*p* may include a voltage generator 823 a cell core 822 that includes a plurality of memory cells coupled to a plurality of word-lines and a plurality of bit-lines and sense amplifiers.

The buffer die 811 may include an ECC engine 812 which corrects a transmission error using the transmission parity bits when a transmission error is detected from the transmission data received through the TSV liens and generates error-corrected data and an error pattern information register 813 that stores error pattern information associated with error pattern of the errors. The ECC engine 812 may employ the ECC engine 400 of FIG. 12 and the error pattern information register 813 may employ the EPIR 580 of FIG. 17.

The semiconductor memory device 800 may be a stack chip type memory device or a stacked memory device which conveys data and control signals through the TSV lines. The TSV lines may be also called 'through electrodes'.

A transmission error which occurs at the transmission data may be due to noise which occurs at the TSV lines. Since data fail due to the noise occurring at the TSV lines may be distinguishable from data fail due to a false operation of the memory die, it may be regarded as soft data fail (or a soft error). The soft data fail may be generated due to transmission fail on a transmission path, and may be detected and remedied by an ECC operation.

A data TSV line group 832 which is formed at one memory die 820-*p* may include TSV lines L1 to Lp, and a parity TSV line group 834 may include TSV lines L10 to Lq. The TSV lines L1 to Lp of the data TSV line group 832 and the parity TSV lines L10 to Lq of the parity TSV line group 634 may be connected to micro bumps MCB which are correspondingly formed among the memory dies 820-1 to 820-*p*.

The semiconductor memory device 800 may have a three-dimensional (3D) chip structure or a 2.5D chip structure to communicate with the host through a data bus B10. The buffer die 810 may be connected with the memory controller 100 through the data bus B10.

Aspects of the present disclosure may be applied to systems using semiconductor memory devices that employ DRAM cells and ECC engine.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A semiconductor memory device comprising:
   a memory cell array comprising a plurality of memory cells coupled to word-lines and bit-lines, and a plurality of sense amplifiers configured to sense data stored in the plurality of memory cells, wherein each memory cell of the plurality of memory cells stores multi-bit data;
   an error correction code (ECC) engine configured to:
      read memory data from a target page of the memory cell array,
      perform an ECC decoding on the memory data,
      detect, based on the ECC decoding, an error in the memory data, and
      output error pattern information indicating an error pattern of the multi-bit data;
   at least one voltage generator configured to provide driving voltages to the plurality of sense amplifiers, respectively; and
   a control logic circuit configured to:
      control the ECC engine, and
      control the at least one voltage generator to increase an operating margin of each of the plurality of sense amplifiers based on the error pattern information,
   wherein the ECC engine is further configured to read a first bit and a second bit from a first memory cell of the target page by:

applying a first charge sharing operation on a first sense amplifier of the plurality of sense amplifiers to obtain the first bit, wherein the first charge sharing operation is based on the operating margin, applying a second charge sharing operation on the first sense amplifier to obtain the second bit, and applying a third charge sharing operation on the first sense amplifier to restore the first bit and the second bit to the first memory cell of the target page.

2. The semiconductor memory device of claim 1, wherein the ECC engine is further configured to generate the error pattern information indicating the error pattern, and wherein the control logic circuit is further configured to:
record the error pattern information, and
control the at least one voltage generator to adjust voltage levels of the driving voltages based on the error pattern information.

3. The semiconductor memory device of claim 2, wherein the first sense amplifier of the plurality of sense amplifiers is coupled to a bit-line and a complementary bit-line of the first memory cell of the plurality of memory cells, and the bit-line is associated with multi-bit data of the first memory cell, wherein the first sense amplifier comprises:
a sense amplifying circuit configured to:
receive a first driving voltage set of the driving voltages, and
sense, based on the first driving voltage set, the first bit of the multi-bit data of the first memory cell and the second bit of the multi-bit data of the first memory cell; and
a latch circuit configured to:
receive a second driving voltage set of the driving voltages,
receive the first bit of the multi-bit data of the first memory cell from the sense amplifying circuit, and
store, based on the second driving voltage set, the first bit of the multi-bit data of the first memory cell, and wherein the control logic circuit is further configured to, based on the error pattern information, control the at least one voltage generator to adjust at least one of a first voltage level of the first driving voltage set, a second voltage level of the second driving voltage set, or a pre-charge voltage, wherein the pre-charge voltage is configured to pre-charge the bit-line and the complementary bit-line, and wherein the memory data includes one first bit and one second bit for each memory cell of the target page.

4. The semiconductor memory device of claim 3, wherein the control logic circuit is further configured to, based on the error pattern information indicating an error tendency and the error tendency being associated with the one second bit in each of the memory data, control the at least one voltage generator to adjust the first voltage level of the first driving voltage set, and
wherein the first voltage level is a first power supply voltage.

5. The semiconductor memory device of claim 4, wherein the control logic circuit is further configured to, based on the error pattern information indicating that the error tendency is associated with the one second bit, and the one first bit not being a same logical level as the one second bit, control the at least one voltage generator to increase the first voltage level of the first driving voltage set.

6. The semiconductor memory device of claim 4, wherein the control logic circuit is further configured to, based on the error pattern information indicating that the error tendency is associated with the one second bit and the one first bit being a same logical level as the one second bit, control the at least one voltage generator to decrease the first voltage level of the first driving voltage set.

7. The semiconductor memory device of claim 3, wherein the control logic circuit is further configured to, based on the error pattern information indicating that an error tendency is associated with the one first bit and the one second bit having the same logical level, control the at least one voltage generator to adjust the pre-charge voltage.

8. The semiconductor memory device of claim 7, wherein the control logic circuit is further configured to, based on the error pattern information indicating that the error tendency is associated with the one first bit and the one second bit both having a high logic level, control the at least one voltage generator to decrease the pre-charge voltage.

9. The semiconductor memory device of claim 7, wherein the control logic circuit is further configured to, based on the error pattern information indicating that the error tendency is associated with the one first bit and the one second bit having a low logic level, control the at least one voltage generator to increase the pre-charge voltage.

10. The semiconductor memory device of claim 3, wherein the control logic circuit is further configured to, based on the error pattern information indicating that an error tendency is associated with all combinations of the one first bit and the one second bit, control the at least one voltage generator to adjust the second voltage level of the second driving voltage set and a third voltage level of a negative voltage, and
wherein the second voltage level is a second power supply voltage, and the third voltage level is applied to a signal node of the latch circuit.

11. The semiconductor memory device of claim 10, wherein the control logic circuit is further configured to, based on the one first bit and the one second bit having a same logic level and the error pattern information indicating that the error tendency is associated with the one second bit, or based on the one first bit and the one second bit having different logic levels and the error pattern information indicating that the error is associated with the one first bit, control the at least one voltage generator to increase the second voltage level of the second driving voltage set and increase the third voltage level of the negative voltage.

12. The semiconductor memory device of claim 10, wherein the control logic circuit is further configured to, based on the one first bit and the one second bit having a same logic level and the error pattern information indicating that the error tendency is associated with the one first bit, or based on the one first bit and the one second bit having different logic levels and the error pattern information indicating that the error is associated with the one second bit, control the at least one voltage generator to decrease the second voltage level of the second driving voltage set and decrease the third voltage level of the negative voltage.

13. The semiconductor memory device of claim 3, wherein the control logic circuit is further configured to, based on the first sense amplifier sensing the first bit of the multi-bit data of the first memory cell and the second bit of the multi-bit data of the first memory cell, control the at least one voltage generator to increase a sensing margin of sensing the first bit and the second bit based on the error pattern information.

14. The semiconductor memory device of claim 3, wherein the first sense amplifier is further configured to perform a restore operation to write a cell voltage corresponding to the first bit of the multi-bit data of the first memory cell to the first memory cell, and
wherein the control logic circuit is further configured to control the at least one voltage generator to increase a difference of a second power supply voltage and a third voltage level of driving voltages which the first sense amplifier uses in the restore operation.

15. The semiconductor memory device of claim 14, wherein the first sense amplifier is configured to perform the restore operation by combining a most significant bit voltage level corresponding to a first version of the first bit of the multi-bit data of the first memory cell latched to the latch circuit with a least significant bit voltage level corresponding to a second version of the second bit of the multi-bit data of the first memory cell sensed by the sense amplifying circuit.

16. The semiconductor memory device of claim 3, further comprising:
a scrubbing control circuit configured to generate scrubbing addresses for performing a scrubbing operation,
wherein the ECC engine is further configured to perform the scrubbing operation based on the scrubbing addresses, and
wherein the control logic circuit is further configured to control the ECC engine to perform the scrubbing operation on a sub-page associated with the error.

17. A semiconductor memory device comprising:
a memory cell array comprising:
a plurality of memory cells coupled to word-lines and bit-lines, each memory cell of the plurality of memory cells storing multi-bit data, and
a plurality of sense amplifiers configured to sense the multi-bit data;
an error correction code (ECC) engine configured to:
read memory data from a target page of the memory cell array,
perform an ECC decoding on the memory data,
generate, based on the ECC decoding, error information indicating an error pattern of the multi-bit data, and
output error pattern information indicating the error pattern of the multi-bit data;
at least one voltage generator configured to provide driving voltages to the plurality of sense amplifiers, respectively; and
a control logic circuit configured to:
control the ECC engine,
control the at least one voltage generator to increase an operating margin of each of the plurality of sense amplifiers based on the error pattern information,
record the error pattern information, and
control the at least one voltage generator to adjust voltage levels of the driving voltages based on the error pattern information,
wherein the ECC engine is configured to read a first bit and a second bit from a first memory cell of the target page by:
applying a first charge sharing operation on a first sense amplifier of the plurality of sense amplifiers to obtain the first bit, wherein the first charge sharing operation is based on the operating margin,
applying a second charge sharing operation on the first sense amplifier to obtain the second bit, and
applying a third charge sharing operation on the first sense amplifier to restore the first bit and the second bit to the first memory cell of the target page.

18. The semiconductor memory device of claim 17, wherein the first sense amplifier of the plurality of sense amplifiers is coupled to a bit-line and a complementary bit-line of the first memory cell of the plurality of memory cells, and the bit-line is associated with multi-bit data of the first memory cell,
wherein the first sense amplifier comprises:
a sense amplifying circuit configured to:
receive a first driving voltage set of the driving voltages, and
sense, based on the first driving voltage set, the first bit of the multi-bit data of the first memory cell and the second bit of the multi-bit data of the first memory cell; and
a latch circuit configured to:
receive a second driving voltage set of the driving voltages,
receive the first bit of the multi-bit data of the first memory cell from the sense amplifying circuit, and
store, based on the second driving voltage set, the first bit of the multi-bit data of the first memory cell, and
wherein the control logic circuit is further configured to control the at least one voltage generator to adjust, based on the error pattern information, a voltage level of at least one of the first driving voltage set, the second driving voltage set, or a pre-charge voltage,
wherein the pre-charge voltage is configured to pre-charge the bit-line and the complementary bit-line.

19. A method of operating a semiconductor memory device, the method comprising:
reading memory data from a target page of a memory cell array of the semiconductor memory device, the memory cell array comprising a plurality of memory cells coupled to word-lines and bit-lines, and a plurality of sense amplifiers configured to sense data stored in the plurality of memory cells, wherein each memory cell of the plurality of memory cells stores multi-bit data;
performing, by an error correction code (ECC) engine of the semiconductor memory device, ECC decoding of the memory data;
generating, by the ECC engine, error pattern information based on the ECC decoding, wherein the error pattern information indicates an error pattern of the multi-bit data;
controlling, by a control logic circuit of the semiconductor memory device, at least one voltage generator to adjust, based on the error pattern information, voltage levels of driving voltages, and wherein the at least one voltage generator is configured to provide the driving voltages to the plurality of sense amplifiers;
sensing the memory data by applying the driving voltages to at least some of the plurality of sense amplifiers; and
restoring the memory data by applying the driving voltages to at least some of the plurality of sense amplifiers
wherein the reading memory data comprises reading at a first bit and a second bit from a first memory cell of the target page by:
applying a first charge sharing operation on a first sense amplifier of the plurality of sense amplifiers to obtain the first bit, wherein the first charge sharing operation is based on an operating margin, applying a second charge sharing operation on the first sense amplifier to obtain the second bit, and applying a third charge sharing operation on the first sense amplifier to restore the first bit and the second bit to the first memory cell of the target page.

\* \* \* \* \*